United States Patent
Hirayama et al.

(10) Patent No.: US 11,269,255 B2
(45) Date of Patent: *Mar. 8, 2022

(54) PHOTOSENSITIVE COMPOSITION AND COLOR CONVERTING FILM

(71) Applicants: Merck Patent GmbH, Darmstadt (DE); AZ Electronic Materials (Luxembourg) S.A.R.L., Luxembourg (LU)

(72) Inventors: Yuki Hirayama, Tokyo (JP); Tadashi Kishimoto, Kanagawa (JP); Masayoshi Suzuki, Tokyo (JP); Daishi Yokoyama, Kakegawa (JP); Katsuto Taniguchi, Shizuoka-Pref. (JP); Toshiaki Nonaka, Machida (JP)

(73) Assignees: Merck Patent GmbH, Darmstadt (DE); AZ Electronic Materials (Luxembourg) S.A.R.L., Luxembourg (LU)

(*) Notice: Subject to any disclaimer, the term of this patent is extended or adjusted under 35 U.S.C. 154(b) by 0 days.

This patent is subject to a terminal disclaimer.

(21) Appl. No.: 16/832,357

(22) Filed: Mar. 27, 2020

(65) Prior Publication Data

US 2020/0319557 A1 Oct. 8, 2020

Related U.S. Application Data

(62) Division of application No. 15/764,080, filed as application No. PCT/EP2016/001464 on Aug. 30, 2016, now Pat. No. 10,678,134.

(30) Foreign Application Priority Data

Sep. 29, 2015 (EP) .................................. 15187390

(51) Int. Cl.
| | | |
|---|---|---|
| *G03F 7/105* | (2006.01) | |
| *G03F 7/00* | (2006.01) | |
| *G03F 7/004* | (2006.01) | |
| *G03F 7/033* | (2006.01) | |
| *G03F 7/16* | (2006.01) | |
| *G03F 7/20* | (2006.01) | |
| *G03F 7/32* | (2006.01) | |
| *G03F 7/40* | (2006.01) | |
| *B82Y 20/00* | (2011.01) | |
| *G02F 1/1335* | (2006.01) | |
| *F21V 8/00* | (2006.01) | |
| *G02F 1/13357* | (2006.01) | |

(52) U.S. Cl.
CPC ............ *G03F 7/105* (2013.01); *G03F 7/0007* (2013.01); *G03F 7/0048* (2013.01); *G03F 7/033* (2013.01); *G03F 7/16* (2013.01); *G03F 7/168* (2013.01); *G03F 7/2004* (2013.01); *G03F 7/32* (2013.01); *G03F 7/40* (2013.01); *B82Y 20/00* (2013.01); *G02B 6/005* (2013.01); *G02F 1/1336* (2013.01); *G02F 1/133614* (2021.01); *G02F 1/133617* (2013.01)

(58) Field of Classification Search
CPC ...... G03F 7/105; G03F 7/0007; G03F 7/0048; G03F 7/033; G03F 7/168; G03F 7/2004; G03F 7/32; G03F 7/40; G03F 7/16; B82Y 20/00
USPC ......................................................... 428/522
See application file for complete search history.

(56) References Cited

U.S. PATENT DOCUMENTS

| | | | |
|---|---|---|---|
| 8,842,364 B2 | 9/2014 | Endoh et al. | |
| 9,359,503 B2 | 6/2016 | Tateishi et al. | |
| 10,108,089 B2 | 10/2018 | Gu et al. | |
| 10,287,490 B2 | 5/2019 | Bohmer et al. | |
| 10,329,479 B2 | 6/2019 | Vo et al. | |
| 2008/0272347 A1* | 11/2008 | Fukuda ............... | G03F 7/0007 252/586 |
| 2012/0195340 A1* | 8/2012 | Cheon ................. | H01L 33/501 372/50.1 |
| 2014/0154627 A1 | 6/2014 | Tanabe | |
| 2015/0191648 A1 | 7/2015 | Vo et al. | |
| 2015/0291876 A1* | 10/2015 | Koole ................. | G02F 1/133603 362/84 |
| 2015/0331165 A1 | 11/2015 | Ryu | |
| 2016/0011506 A1 | 1/2016 | Gu et al. | |
| 2016/0282530 A1* | 9/2016 | Ogura ................. | C09B 11/08 |
| 2016/0376498 A1* | 12/2016 | Qiu ................... | C08K 3/32 252/301.36 |
| 2018/0057735 A1 | 3/2018 | Vo et al. | |

FOREIGN PATENT DOCUMENTS

| | | |
|---|---|---|
| CN | 1804722 A | 7/2006 |
| CN | 101081941 A | 12/2007 |
| CN | 101546006 A | 9/2009 |
| CN | 103718107 A | 4/2014 |
| CN | 103857752 A | 6/2014 |
| CN | 104536065 A | 4/2015 |
| EP | 1864991 A1 | 12/2007 |
| JP | 2014174406 A | 9/2014 |
| JP | 2019025565 A | 2/2019 |
| JP | 2019144543 A | 8/2019 |

(Continued)

OTHER PUBLICATIONS

International Search Report PCT/EP2016/001464 dated Nov. 9, 2016.

(Continued)

*Primary Examiner* — Hui H Chin
(74) *Attorney, Agent, or Firm* — Millen White Zelano and Branigan, PC; Richard Traverso

(57) ABSTRACT

The present invention relates to a photosensitive composition, and a color conversion film. The present invention further relates to a use of the photosensitive composition in a color conversion film fabrication process, and to a use of the color conversion film in an optical device. The invention further more relates to an optical device comprising the color conversion film and method for preparing the color conversion film and the optical device.

18 Claims, 5 Drawing Sheets

(56) References Cited

FOREIGN PATENT DOCUMENTS

| | | | |
|---|---|---|---|
| TW | 200722207 A | 6/2007 | |
| TW | 200745747 A | 12/2007 | |
| TW | 201422765 A | 6/2014 | |
| TW | 201532952 A | 9/2015 | |
| WO | 2012059931 A1 | 5/2012 | |
| WO | 2014129067 A1 | 8/2014 | |
| WO | 2015079911 A1 | 6/2015 | |
| WO | WO-2015079911 A1 * | 6/2015 | ............... C08F 2/48 |
| WO | 15100968 A1 | 7/2015 | |
| WO | 2015138174 A1 | 9/2015 | |
| WO | 2016134820 A1 | 9/2016 | |

OTHER PUBLICATIONS

Office Action in corresponding JP Patent Application No. 2018-517300 dated Aug. 4, 2020 (pp. 1-4) and english translation thereof (pp. 1-4).

English translation of Office Action in corresponding ROC (Taiwan) Patent Application No. 109136511 dated Feb. 23, 2021 (pp. 1-12).

* cited by examiner

PHOTOSENSITIVE COMPOSITION AND COLOR CONVERTING FILM

FIELD OF THE INVENTION

The present invention relates to a photosensitive composition, and a color conversion film. The present invention further relates to a use of the photosensitive composition in a color conversion film fabrication process, and to a use of the color conversion film in an optical device. The invention further more relates to an optical device comprising the color conversion film and method for preparing the color conversion film and the optical device.

BACKGROUND ART

A photo sensitive composition comprising a nanosized fluorescent material and polymer, color conversion film including a fluorescent material and optical devices comprising a light conversion film are used in a variety of optical applications especially for optical devices.

For example, as described in JP 2014-174406 A, WO 2014/129067 A1, WO 2012/059931A1, JP 3820633 B, EP 01403355 A, JP 2014-10398 A, EP 02056158 A, WO 2010/143461 A1,

PATENT LITERATURE

1. JP 2014-174406 A
2. WO 2014/129067 A1
3. WO 2012/059931 A1
4. JP 3820633 B
5. JP 2014-10398 A
6. EP 01403355 A
7. EP 02056158 A
8. WO 2010/143461 A1

SUMMARY OF THE INVENTION

However, the inventors newly have found that there is still one or more of considerable problems for which improvement is desired, as listed below.
1. A novel photosensitive composition comprising a nanosized fluorescent material such as quantum sized materials, a wetting and dispersing agent, and a polymer, which may reduce or prevent a dark reaction of the photosensitive composition, is desired.
2. A novel photosensitive composition comprising a nanosized fluorescent material such as quantum sized materials, a wetting and dispersing agent, and a polymer, which shows improved development ability when it is developed in an alkali developer, is required.
3. A novel photosensitive composition comprising a nanosized fluorescent material such as quantum sized materials, a wetting and dispersing agent, and a polymer, which fits to lower temperature film preparation process well.

The inventors aimed to solve all of the aforementioned problems. Surprisingly, the inventors have found a novel photosensitive composition comprising a plurality of nanosized fluorescent material, a (meth)acrylic polymer, and a wetting and dispersing agent, wherein the wetting and dispersing agent comprises an anchoring group selected from the group consisting of phosphine groups, phosphine oxide groups, phosphate groups, phosphonate groups, thiol groups, tertiary amine, carboxyl groups, hetero cyclic groups, silane groups, sulfonic acids, hydroxyl groups, and phosphonic acids, solves all the problems 1 to 3 at the same time.

In another aspect, the invention relates to a color conversion film (100) comprising a plurality of nanosized fluorescent material (110), a wetting and dispersing agent (130), and a polymer matrix (120), wherein the wetting and dispersing agent comprises an anchoring group selected from the group consisting of phosphine groups, phosphine oxide groups, phosphate groups, phosphonate groups, thiol groups, tertiary amine, carboxyl groups, hetero cyclic groups, silane groups, sulfonic acids, hydroxyl groups, and phosphonic acids.

In another aspect, the invention relates to use the photosensitive composition in a color conversion film fabrication process.

In another aspect, the invention relates to use of the color conversion film (100) in an optical device.

In another aspect, the invention further relates to an optical device (200) comprising the color conversion film (100).

In another aspect, the present invention furthermore relates to method for preparing the color conversion film (100), wherein the method comprises following steps (a) and (b) in this sequence;
(a) providing the photosensitive composition onto a substrate, and
(b) polymerizing the photosensitive composition by heat treatment, or exposing the photosensitive composition under ray of light or a combination of any of these In another aspect, the present invention furthermore relates to method for preparing the optical device (200), wherein the method comprises following step (A);
(A) providing the color conversion film (100) in an optical device Further advantages of the present invention will become evident from the following detailed description.

LIST OF REFERENCE SIGNS IN FIG. 1

Figure 1:
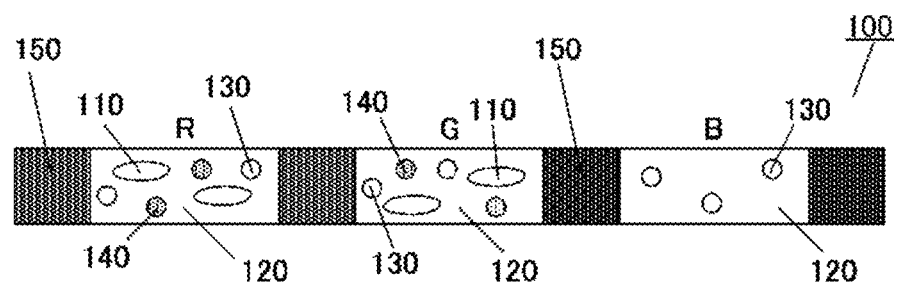
FIG. 1: shows a cross sectional view of a schematic of one embodiment of a color conversion film (100).

100. a color conversion film
110. a nanosized fluorescent material
120. a polymer matrix
130. a light scattering particle (optional)
140. a coloring agent (optional)
150. a black matrix (optional)

LIST OF REFERENCE SIGNS IN FIG. 2

200. a color conversion film
210. a nanosized fluorescent material 220. a polymer matrix
230. a light scattering particle (optional)
240. a coloring agent (optional)

LIST OF REFERENCE SIGNS IN FIG. 3

300. an optical device
310. a color conversion film
311. a nanosized fluorescent material
312. a polymer matrix
313. a light scattering particle (optional)
314. a coloring agent (optional)
315. a black matrix (optional)
320. a light modulator
321. a polarizer
322. an electrode
323. a liquid crystal layer
330. a light source
331. a LED light source
332. a light guiding plate (optional)

LIST OF REFERENCE SIGNS IN FIG. 4

400. an optical device
410. a color conversion film
411. a nanosized fluorescent material
412. a polymer matrix
413. a light scattering particle (optional)
414. a coloring agent (optional)
415. a black matrix (optional)
420. a light modulator
421. a polarizer
422. an electrode
423. a liquid crystal layer
430. a light source
431. a LED light source
432. a light guiding plate (optional)
440. a color filter (optional)

LIST OF REFERENCE SIGNS IN FIG. 5

500. an optical device
510. a color conversion film
511. a nanosized fluorescent material
512. a polymer matrix
513. a light scattering particle (optional)
514. a coloring agent (optional)
520. a light modulator
521. a polarizer
522. an electrode
523. a liquid crystal layer
530. a light source
540. a color filter

LIST OF REFERENCE SIGNS IN FIG. 6

600. an optical device
610. a color conversion film fabricated into a light modulator
611. a nanosized fluorescent material
612. a polymer matrix
613. a light scattering particle (optional)
614. a coloring agent (optional)
620. a light modulator
621. a transparent substrate
622. a transparent electrode
623. a LC layer (doped with Dichroic Dye)
624. a transparent pixel electrode
625. a TFT (Thin film transistor)
630. a light source

LIST OF REFERENCE SIGNS IN FIG. 7

700. an optical device
710. a color conversion film
711. a nanosized fluorescent material
712. a polymer matrix
713. a light scattering particle (optional)
714. a coloring agent (optional)
715. a black matrix (optional)
720. a light modulator
721. a transparent substrate
722. a TFT (Thin film transistor)
723. MEMS (Micro Electro Mechanical Systems) Shutter
730. a light source
731. a LED light source
732. a light guiding plate (optional)

DETAILED DESCRIPTION OF THE INVENTION

According to the present invention, a photosensitive composition comprising a plurality of nanosized fluorescent material, a (meth)acrylic polymer and a wetting and dispersing agent, wherein the wetting and dispersing agent comprises an anchoring group selected from the group consisting of phosphine groups, phosphine oxide groups, phosphate groups, phosphonate groups, thiol groups, tertiary amine, carboxyl groups, hetero cyclic groups, silane groups, sulfonic acids, hydroxyl groups, and phosphonic acids, is provided by the inventors to solve all the problems 1 to 3 at the same time.

Wetting and Dispersing Agents

According to the present invention, the photosensitive composition comprises a wetting and dispersing agent comprising an anchoring group selected from the group consisting of phosphine groups, phosphine oxide groups, phosphate groups, phosphonate groups, thiol groups, tertiary amine, carboxyl groups, hetero cyclic groups, silane groups, sulfonic acids, hydroxyl groups, and phosphonic acids.

In a preferred embodiment of the present invention, the anchoring group of the wetting and dispersing agent can be selected from the group consisting of tertiary amine, phosphine oxide groups, phosphonic acids, and phosphate groups.

More preferably, to prevent dark reaction, the anchoring group can be a tertiary amine represented by following chemical formula (I).

$$—NR_1R_2— \quad (I)$$

Wherein the chemical formula (I), $R_1$ is a hydrogen atom, alkyl group having carbon atoms 1 to 30, or an aryl group having carbon atoms 1 to 30; $R_2$ is a hydrogen atom, alkyl group having carbon atoms 1 to 30, or an aryl group having carbon atoms 1 to 30; $R_1$ and $R_2$ can be same or different of each other.

Even more preferably, $R_1$ is an alkyl group having carbon atoms 1 to 30; $R_2$ is an alkyl group having carbon atoms 1 to 30; $R_1$ and $R_2$ can be same or different of each other.

Furthermore preferably, $R_1$ is methyl group, ethyl group, n-propyl group, or n-butyl group; $R_2$ is methyl group, ethyl group, n-propyl group, or n-butyl group.

According to the present invention, the anchoring group is not a salt.

Without wishing to be bound by theory, it is believed that the dispersing agent comprising an anchoring group selected from the group consisting of phosphine groups, phosphine oxide groups, phosphate groups, phosphonate groups, thiol groups, tertiary amine, carboxyl groups, hetero cyclic groups, silane groups, sulfonic acids, hydroxyl groups, and phosphonic acids, may prevent a dark reaction of the photosensitive composition.

In a preferred embodiment of the present invention, the wetting and dispersing additive can be attached directly onto the surface of the nanosized fluorescent material. By using ligand exchange method, described in for example, Thomas Nann, Chem. Commun., 2005, 1735-1736, DOI: 10.1039/b-414807j, the wetting and dispersing additive can be introduced onto the surface of the nanosized fluorescent material.

In some embodiments of the present invention, preferably, the wetting and dispersing agent is a copolymer selected from the group consisting of graft copolymers, block copolymers, alternating copolymers, and random copolymers.

In some embodiments of the present invention, more preferably, the copolymer comprises polymer unit A including the anchoring group, and polymer unit B that does not include any one of the anchoring group.

In some embodiments of the present invention, even more preferably, the copolymer is a block copolymer or a graft copolymer represented by following chemical formula (II) or (III).

$$A_n\text{-}B_m\text{—} \qquad (II)$$

$$B_o\text{-}A_n\text{-}B_m\text{—} \qquad (III)$$

(Where in the formulae (II) and (III), the symbol "A" represents polymer unit A including the anchoring group; the symbol "B" is taken to mean the polymer unit B that does not include any one of the anchoring group; the symbols "n", "m", and "o" are integer.)

In some embodiments of the present invention, the polymer unit B of the wetting and dispersing agent comprises a polymer chain selected from the group consisting of polyethylene glycols, polyester, polylactic acids, polyvinyl alcohols, polyvinylpyrrolidones, celluloses and derivatives of any of these.

In a preferred embodiment of the present invention, the polymer chain of the polymer unit B is a polyethylene glycol.

More preferably, the polymer unit B comprises a chemical structure represented by following chemical formula (IV).

Chemical formula (IV)

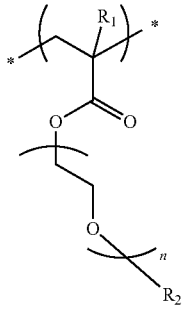

Wherein the chemical formula (IV), $R_1$ is hydrogen atom, or methyl group; $R_2$ is alkyl group having carbon atoms 1 to 10; and n is an integer 1 to 5.

Even more preferably, $R_1$ can be a hydrogen atom, or methyl group, $R_2$ can be an ethyl group, and n is an integer 1 to 5.

According to the present invention, the weight-average molecular weight of the wetting and dispersing agent is not particularly limited.

Preferably, it is in the range from 2,000-100,000, more preferably, it is in the range from 5,000-30,000 from the view point of better dispersivity and film strength.

According to the present invention, the molecular weight $M_w$ is determined by means of GPC (=gel permeation chromatography) against an internal polystyrene standard.

As the wetting and dispersing additives, commercially available wetting and dispersing additives which can be solved in non-polar and/or low polar organic solvent can be used preferably. Such as BYK-LPN6919, BYK-103, BYK-P104 ([trademark], from BYK corm), Poly(ethylene glycol) methyl ether amine (Sigma-Ald 767565 [trademark], from Sigma Aldrich), Polyester bis-MPA dendron, 32 hydroxyl, 1 thiol, (Sigma-Ald 767115 [trademark], from Sigma Aldrich), LIPONOL DA-T/25 (From Lion Specialty Chemicals Co.), Carboxymethyl cellulose (from Polyscience etc.), another wetting and dispersing additives disclosed in for examples, "Marc Thiry et. al., ACSNANO, American Chemical society, Vol. 5, No. 6, pp 4965-4973, 2011", "Kimihiro Susumu, et. al., J. Am. Chem. Soc. 2011, 133, pp 9480-9496".

Nanosized Fluorescent Materials

In a preferred embodiment of the present invention, the nanosized fluorescent material can be selected from the group consisting of nanosized inorganic phosphor materials, quantum sized materials such as quantum dots and or quantum rods and a combination of any of these.

Without wishing to be bound by theory, it is believed that the nanosized fluorescent material can be used in a higher concentration ratio due to size effect and also may realize sharp vivid color(s) of the color conversion film.

More preferably, the nanosized fluorescent material is a quantum sized material, with furthermore preferably being of a quantum dot material, quantum rod material or a combination of any of these.

According to the present invention, the term "nanosized" means the size in between 1 nm and 900 nm.

Thus, according to the present invention, the nanosized fluorescent material is taken to mean that the fluorescent material which size of the overall diameter is in the range from 1 nm to 900 nm. And in case of the material has elongated shape, the length of the overall structures of the fluorescent material is in the range from 1 nm to 900 nm.

According to the present invention, the term "quantum sized" means the size of the inorganic semiconductor material itself without ligands or another surface modification, which can show the quantum size effect.

Generally, quantum sized material such as quantum dot material, and/or quantum rod material can emit sharp vivid colored light due to quantum size effect.

As a quantum dot, publically available quantum dot, for examples, CdSeS/ZnS alloyed quantum dots product number 753793, 753777, 753785, 753807, 753750, 753742, 753769, 753866, InP/ZnS quantum dots product number 776769, 776750, 776793, 776777, 776785, PbS core-type quantum dots product number 747017, 747025, 747076, 747084, or CdSe/ZnS alloyed quantum dots product number 754226, 748021, 694592, 694657, 694649, 694630, 694622 from Sigma-Aldrich, can be used preferably as desired.

Without wishing to be bound by theory, it is believed that light luminescence from dipole moment of the nanosized fluorescent material having elongated shape may lead higher out-coupling efficiency than the out-coupling efficiency of spherical light emission from quantum dot, organic fluorescent material, and/or organic phosphorescent material, phosphor material.

In other words, it is believed that the long axis of the nanosized fluorescent materials having elongated shape such as quantum rods can align parallel to a substrate surface on average with higher probability and their dipole moments also can align parallel to the substrate surface on average with higher probability.

Thus, according to the present invention, to realize sharp vivid color(s) of the device and better out-coupling effect at the same time, quantum rod materials are more preferable if desired.

Thus, in some embodiments, the nanosized fluorescent material can be selected from a quantum rod material to realize better out-coupling effect.

In a preferred embodiment of the present invention, the quantum rod material can be selected from the group consisting of II-VI, III-V, or IV-VI semiconductors and combinations of any of these.

More preferably, the quantum rod material can be selected from the groups consisting of Cds, CdSe, CdTe, ZnS, ZnSe, ZnTe, ZnO, GaAs, GaP, GaAs, GaSb, HgS, HgSe, HgSe, HgTe, InAs, InP, InSb, AlAs, AlP, AlSb, $Cu_2S$, $Cu_2Se$, $CuInS_2$, $CuInSe_2$, $Cu_2(ZnSn)S_4$, $Cu_2(InGa)S_4$, $TiO_2$ alloys and combination of any of these.

For example, for red emission use, CdSe rods, CdSe dot in CdS rod, ZnSe dot in CdS rod, CdSe/ZnS rods, InP rods, CdSe/CdS rods, ZnSe/CdS rods or combination of any of these. For green emission use, such as CdSe rods, CdSe/ZnS rods, or combination of any of these, and for blue emission use, such as ZnSe, ZnS, ZnSe/ZnS core shell rods, or combination of any of these.

Examples of quantum rod material have been described in, for example, the international patent application laid-open No. WO2010/095140A.

In a preferred embodiment of the invention, the length of the overall structures of the quantum rod material/or the quantum dot material is from 8 nm to 500 nm. More preferably, from 10 nm to 160 nm. The overall diameter of the said quantum rod material is in the range from 1 nm to 20 nm. More particularly, it is from 1 nm to 10 nm.

Preferably, the nanosized fluorescent material such as quantum rod and/or quantum dot comprises a surface ligand.

The surface of the quantum rod and/or quantum dot materials can be over coated with one or more kinds of surface ligands.

Without wishing to be bound by theory it is believed that such a surface ligands may lead to disperse the nanosized fluorescent material in a solvent more easily.

The wetting and dispersing agent can be attached onto the surface of the ligand of the nanosized fluorescent material or directly attached onto the surface of the nanosized fluorescent material partially or fully by using ligand exchange process as described in—Wetting and dispersing agents.

According to the present invention, preferably, the photosensitive composition is a green type photosensitive composition containing the plurality of the green visible light emittable nanosized fluorescent materials, red type photosensitive composition comprising the plurality of the red visible light emittable nanosized fluorescent materials, or white type photosensitive composition containing the plurality of the different kinds of nanosized fluorescent materials, such as the mixture of the green visible light emittable nanosized fluorescent materials and the red light emittable nanosized fluorescent materials.

(Meth)Acrylic Polymers

According to the present invention, the term "(meth) acrylic polymer" means a general term of polymer obtained by polymerization of monomers selected from the group consisting of acrylic acid, methacrylic acid, acrylate, methacrylate, and a combination of any of these.

As the (meth)acrylic polymer, publically known one or more of (meth)acrylic polymers can be used.

In some embodiments of the present invention, preferably, the (meth)acrylic polymer comprises a (meth)acrylic unit including an acid group.

In a preferred embodiment of the present invention, the (meth)acrylic unit including an acid group can be a (meth) acrylic unit including a side chain selected from the group consisting of carboxyl group, sulfo group, or phenol type hydroxyl group.

Without wishing to be bound by theory, it is believed that the (meth)acrylic polymer which includes a (meth)acrylic unit including an acid group may lead to better solubility of the uncured part of the photosensitive composition to a developer.

According to the present invention, the number of the acid group is not particularly limited. From reconcile better reactivity and storage stability of the photosensitive composition, the acid value of the (meth)acrylic polymer is in the range from 5 to 500 mg KOH/g preferably. More preferably, it is from 50 mg KOH/g to 300 mg KOH/g.

And in some embodiments of the present invention, preferably, the (meth)acrylic polymer further comprises a silane modified (meth)acrylic unit.

As the examples of the silane modified (meth)acrylic unit, siloxy group and/or silanol group substituted (meth)acrylic unit, (meth)acrylic unit fabricated by reaction with a silane coupling agent including carbon-carbon unsaturated bond, silicone oligomer, silicone oil can be used preferably.

More preferably, a copolymer made from silane coupling agent and (meth)acrylic polymers having a (meth)acrylic unit including an acid group can be used preferably.

Here, as the examples of the silane coupling agent, KBM-1003, KME-1003, KBM-1403 or KBM-5103 (from Shinetsu. Co.), and as the examples of the silicone oil, X-22-174DX, X-22-2426, X-22-2475, or X-22-1602 (from Shinetsu. Co.) can be used preferably.

By changing the molar ratio of (meth)acrylic unit including an acid group and the silane modified (meth)acrylic unit in the (meth)acrylic polymer, solubility of the (meth)acrylic polymer in an alkali developer can be adjusted as desired.

In a preferred embodiment of the present invention, the molar ratio of the (meth)acrylic unit including an acid group and the silane modified (meth)acrylic unit in the (meth) acrylic polymer can be from 95:5 ((meth)acrylic unitincluding an acid group: the silane modified (meth)acrylic unit) to 30:70 ((meth)acrylic unit including an acid group: the silane modified (meth)acrylic unit), from the view point of better solubility in an alkali developer, good development property of the photosensitive composition comprising a plurality of nanosized fluorescent material, a (meth)acrylic polymer and a wetting and dispersing agent.

More preferably, it can be from 90:10 ((meth)acrylic unit including an acid group: the silane modified (meth)acrylic unit) to 50:50 ((meth)acrylic unit including an acid group: the silane modified (meth)acrylic unit).

According to the present invention, the number of the unsaturated bond of the silane modified (meth)acrylic unit is not particularly limited. From reconcile better reactivity and compatibility with another ingredients of the photosensitive composition, the value of double bond equivalent (ethylenically unsaturated bond equivalent) in the (meth)acrylic polymer is in the range from 1 to 500 g/eq preferably.

In another embodiments of the present invention, the (meth)acrylic polymer can be a (meth)acrylic polymer which includes a repeating unit containing acid group.

As the (meth)acrylic polymer which includes a repeating unit containing acid group, (meth)acrylic polymer including a side chain selected from the group consisting of carboxyl group, sulfo group, or phenol type hydroxyl group.

According to the present invention, the number of the acid group is not particularly limited. From reconcile better reactivity and storage stability of the photosensitive composition, the acid value of the (meth)acrylic polymer is in the range from 5 to 500 mg KOH/g preferably. More preferably, it is from 50 mg KOH/g to 300 mg KOH/g.

According to the present invention, the weight-average molecular weight of the (meth)acrylic polymer is not particularly limited.

Preferably, it is in the range from 2,000-100,000, more preferably, it is in the range from 3,000-30,000.

In a preferred embodiment of the present invention, the photosensitive composition can further comprises silane modified (meth)acrylic polymer in addition to the (meth)acrylic polymer which includes a repeating unit containing acid group to adjust solubility of the photosensitive composition.

As the examples of the silane modified (meth)acrylic polymer, siloxy group and/or silanol group substituted (meth)acrylic polymers, (meth)acrylic polymers reacted with a silane coupling agent including carbon-carbon unsaturated bond, silicone oligomer, or silicone oil can be used preferably.

More preferably, a copolymer made from silane coupling agent and (meth)acrylic polymers can be used as the silane modified (meth)acrylic polymer.

Here, as the examples of the silane coupling agent, KBM-1003, KME-1003, KBM-1403 or KBM-5103 (from Shinetsu. Co.), and as the examples of the silicone oil, X-22-174DX, X-22-2426, X-22-2475, or X-22-1602 (from Shinetsu. Co.) can be used preferably.

According to the present invention, the number of the unsaturated bond is not particularly limited. From reconcile better reactivity and compatibility, the value of double bond equivalent (ethylenically unsaturated bond equivalent) in the (meth)acrylic polymer is in the range from 10 to 500 g/eq preferably.

In a preferred embodiment of the present invention, the molar ratio of the (meth)acrylic polymer including an acid group and the silane modified (meth)acrylic polymer in the photosensitive composition can be from 95:5 ((meth)acrylic polymer including an acid group: the silane modified (meth)acrylic polymer) to 30:70 ((meth)acrylic polymer including an acid group: the silane modified (meth)acrylic polymer), from the view point of better solubility in an alkali developer, good development property of the photosensitive composition comprising a plurality of nanosized fluorescent material, a (meth)acrylic polymer and a wetting and dispersing agent.

More preferably, it can be from 90:10 ((meth)acrylic polymer including an acid group: the silane modified (meth) acrylic polymer) to 50:50 ((meth)acrylic polymer including an acid group: the silane modified (meth)acrylic polymer).

According to the present invention, optionally, the photosensitive composition can further comprises polysiloxane to realize better thermal stability, transparency, and chemical stability of the color conversion film made from the photosensitive composition.

In that case, the blending ratio of the (meth)acrylic polymer and the polysiloxane is not particularly limited.

From the view point of better thermal stability, transparency, and chemical stability of the color conversion film, the blending ratio of the (meth)acrylic polymer and the polysiloxane can be from 100:0 ((meth)acrylic polymer:polysiloxane) to 10:90 preferably.

More preferably, from the view point of better solubility in an alkali developer and fine development ability of the photosensitive composition, it is in the range from 100:0 to 50:50.

According to the present invention, the photosensitive composition can be either a positive-type photosensitive composition or a negative-type photosensitive composition.

Positive-Type Photosensitive Composition

The photosensitive composition according to the present invention can further comprise a positive-type photosensitive material so that the photosensitive composition can function as a positive-type photosensitive composition.

Positive-Type Photosensitive Material

If the photosensitive material has an effect on the photosensitive composition of the present invention to make it developable so that the composition spread in an exposed area can be soluble in an alkali developer, the photosensitive composition containing the photosensitive material serves as a positive-type photosensitive composition.

Preferred examples of the photosensitive material having the above effect include diazonaphthoquinone derivatives, which are esters of phenolic hydroxyl-containing compounds with naphtha-quinonediazidesulfonic acids. There are no particular restrictions on the structure of the diazonaphtoquinone derivative, the derivative is preferably an ester compound derived from a compound having one or more phenolic hydroxyl groups. Examples of the naphthaquinonediazidesulfonic acids include 4-naphthoquinonediazidesulfonic acid and 5-naphthoquinonediazidesulfonic acid. Since having an absorption band in the wavelength range of i-line light (wavelength: 365 nm), the 4-naphthoquinonediazidesulfonic ester compound is suitable for i-line light exposure. On the other hand, since having an absorption band in a wide wavelength range, the 5-naphthoquinonediazidesulfonic ester compound is suitable for exposure in a wide wavelength range. Accordingly, it is preferred to select 4- or 5-naphthoquinonediazidesulfonic ester compound according to the wavelength for exposure. It is also possible to use both of them in combination.

There are no particular restrictions on the phenolic hydroxyl-containing compound. Examples thereof are shown as follows (in which all the compound names except "bisphenol A" are trade names [trademark] manufactured by HONSHU CHEMICAL INDUSTRY CO., LTD.).

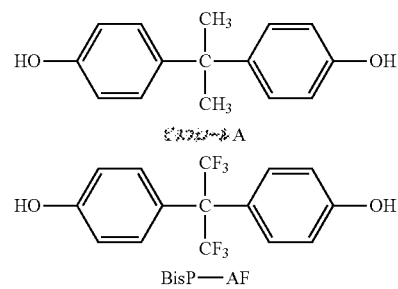

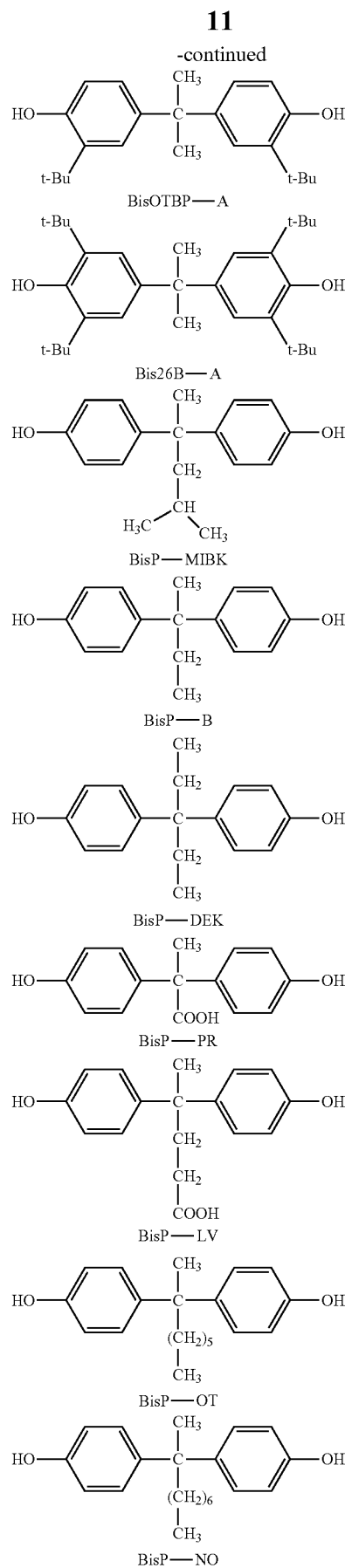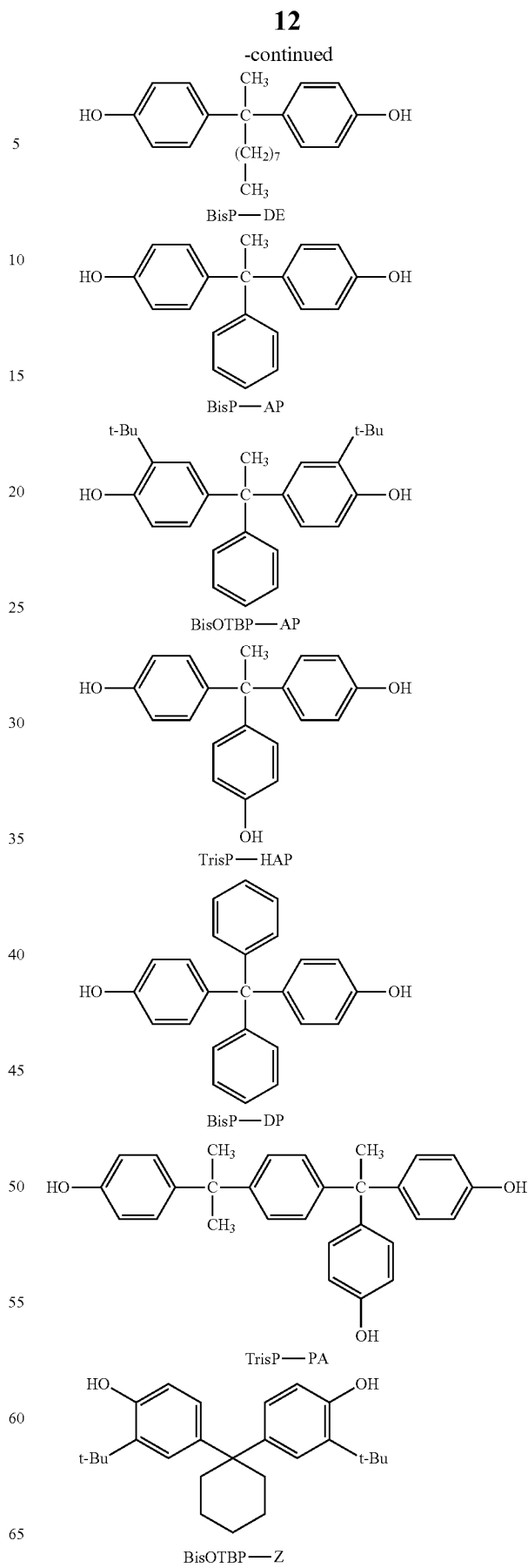

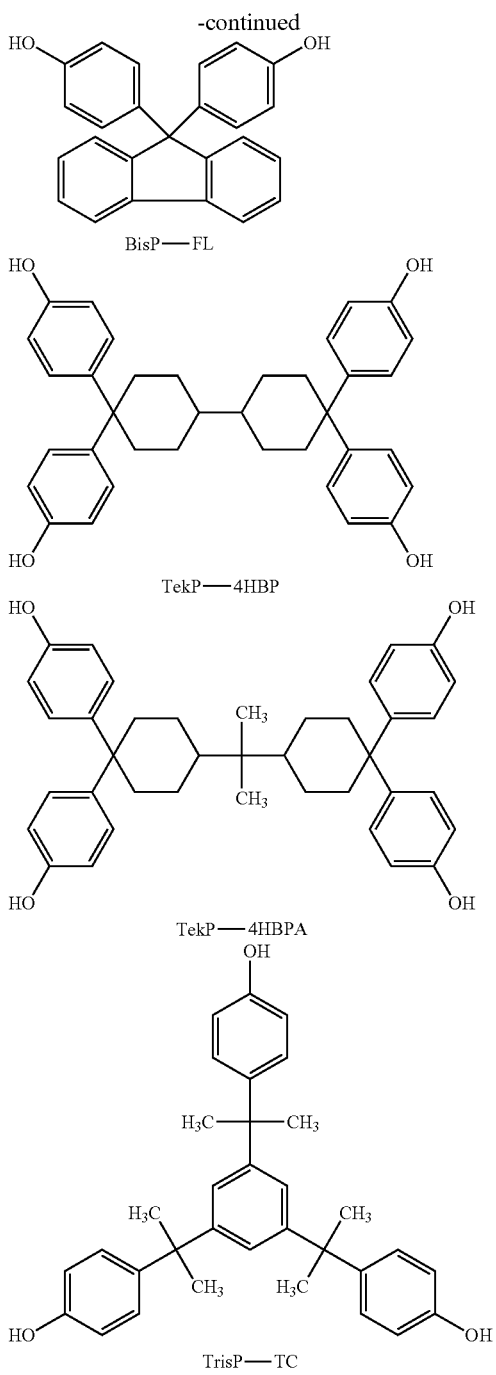

BisP—FL

TekP—4HBP

TekP—4HBPA

TrisP—TC

Negative-Type Photosensitive Composition

According to the present invention, if the photosensitive composition does not contain any positive-type photosensitive composition, then the photosensitive composition serves as a negative-type photosensitive composition.

In some embodiments of the present invention, preferably, the photo sensitive composition is a negative type photosensitive composition comprising a polymerization initiator.

Polymerization Initiator

The photosensitive composition of the present invention preferably contains the polymerization initiator. Generally, there are two kinds of polymerization initiators which can be used in the present invention: one is a polymerization initiator generating an acid, base, or radical when exposed to radiation, and the other is a polymerization initiator generating an acid, base or radical when exposed to heat.

Without wishing to be bound by theory, it is believed that the polymerization initiator can reinforce the pattern shape or can increase contrast in development to improve the resolution. The polymerization initiator adoptable in the present is, for example, a photo acid-generator, which decomposes when exposed to radiation and releases an acid serving as an active substance for photo-curing the composition; a photo radical-generator, which releases a radical; a photo base-generator, which releases a base; a heat acid-generator, which decomposes when exposed to heat and releases an acid serving as an active substance for heat-curing the composition; a heat radical-generator, which releases a radical; and a heat base-generator, which releases a base. Examples of the radiation include visible light, UV rays, IR rays, X-rays, electron beams, α-rays and γ-rays.

The optimal amount of the polymerization initiator depends on the kind of the active substance released from the decomposed initiator, on the amount of the released substance, on the required sensitivity and on the dissolution contrast between the exposed and unexposed areas.

In a preferred embodiment of the present invention, the amount of the polymerization initiator is in the range from 0.001 to 10 weight parts, more preferably 0.01 to 5 weight parts, based on 100 weight parts of the (meth)acrylic polymer. More than 0.001 weight part is preferable to realize the better dissolution contrast between the exposed and unexposed areas and to obtain the effect of the initiator. On the other hand, less than 10 weight parts of the polymerization initiator is preferable to prevent cracks of the fabricated color conversion film (100), or coloring of the fabricated film caused by decomposition of the initiator and to realize good resistance of the coating against a photoresist remover.

Examples of the above photo acid-generator include diazomethane compounds, diphenyliodonium salts, triphenylsulfonium salts, sulfonium salts, ammonium salts, phosphonium salts and sulfonamide compounds. The structures of those photo acid-generators can be represented by the formula (A):

$$R^+X^-  \quad\quad (A).$$

Wherein the formula (A), $R^+$ is hydrogen or an organic ion modified by carbon atoms or other hetero atoms provided that the organic ion is selected from the group consisting of alkyl groups, aryl groups, alkenyl groups, acyl groups and alkoxy groups. For example, $R^+$ is diphenyliodonium ion or triphenylsulfonium ion.

Further, $X^-$ is preferably a counter ion represented by any of the following formulas:
$SbY_6^-$,
$AsY_6^-$,
$R^a_p PY_{6-p}^-$,
$R^a_q BY_{4-q}^-$,
$R^a_q GaY_{4-q}^-$,
$RaSO_3^-$,
$(R^a SO_2)_3 C^-$,
$(R^a SO_2)_2 N^+$,
$R^a COO^-$, and
$SCN^-$
in which
Y is a halogen atom,
$R^a$ is an alkyl group of 1 to 20 carbon atoms or an aryl group of 6 to 20 carbon atoms provided that each group is substituted with a substituent group selected from the group consisting of fluorine, nitro group and cyano group,
$R^b$ is hydrogen or an alkyl group of 1 to 8 carbon atoms,
P is a number of 0 to 6, and
q is a number of 0 to 4.

Concrete examples of the counter ion include: $BF_4^-$, $(C_6F_6)_4B^-$, $((CF_3)_2C_6H_3)_4B^-$, $PF_6^-$, $(CF_3CF_2)_3PF_3^-$, $SbF_6^-$, $(C_6F_6)_4Ga^-$, $((CF_3)_2C_6H_3)_4Ga^-$, $SCN^-$, $(CF_3SO_2)_3C^-$, $(CF_3SO_2)_2N^-$, formate ion, acetate ion, trifluoromethanesulfonate ion, nonafluorobutanesulfonate ion, methanesulfonate ion, butanesulfonate ion, benzenesulfonate ion, p-toluenesulfonate ion, and sulfonate ion.

Among the photo acid-generators usable in the present invention, those generating sulfonic acids or boric acids are particularly preferred. Examples thereof include tricumyliodonium teterakis(pentafluorophenyl)-borate (PHOTOINITIATOR2074 [trademark], manufactured by Rhodorsil), diphenyliodonium tetra(perfluorophenyl)borate, and a compound having sulfonium ion and pentafluoroborate ion as the cation and anion moieties, respectively. Further, examples of the photo acid-generators also include triphenylsulfonium trifluoromethanesulfonate, triphenylsulfonium camphor-sulfonate, triphenylsulfonium tetra(perfluorophenyl)borate, 4-acetoxyphenyldimethylsulfonium hexafluoroarsenate, 1-(4-n-butoxynaphthalene-1-yl)tetrahydrothiophenium trifluoromethanesulfonate, 1-(4,7-dibutoxy-1-naphthalenyl)tetrahydrothiophenium tri-fluoromethanesulfonate, diphenyliodonium trifluoromethanesulfonate, and diphenyliodonium hexafluoroarsenate. Furthermore, it is still also possible to adopt photo acid-generators represented by the following formulas:

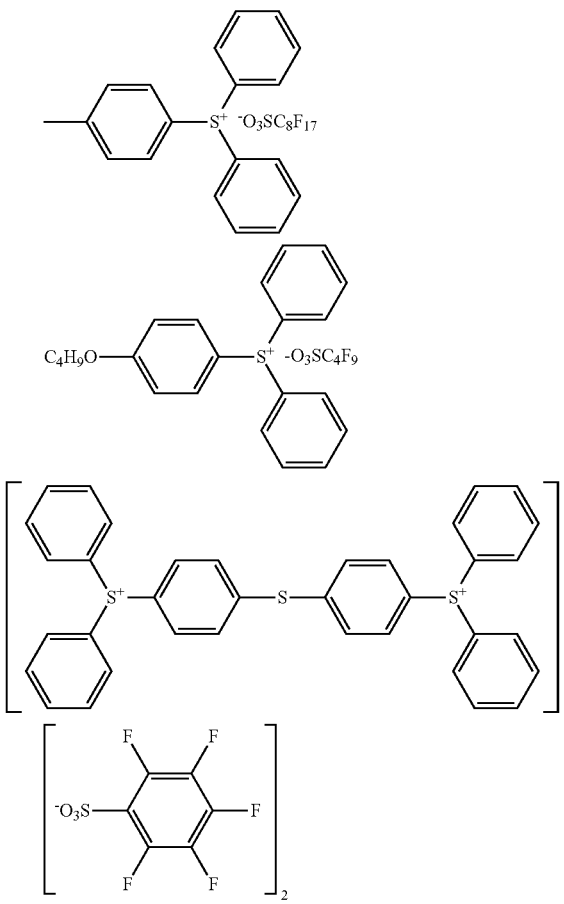

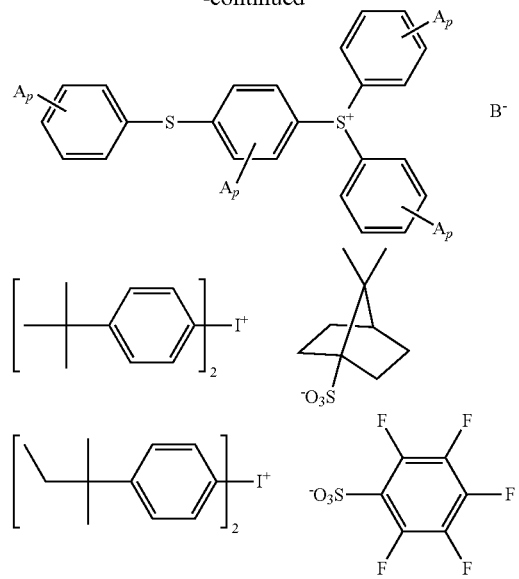

in which each A is independently a substituent group selected from the group consisting of an alkyl group of 1 to 20 carbon atoms, an alkoxy group of 1 to 20 carbon atoms, an aryl group of 6 to 20 carbon atoms, an alkylcarbonyl group of 1 to 20 carbon atoms, an arylcarbonyl group of 6 to 20 carbon atoms, hydroxyl group, and amino group;

each p is independently an integer of 0 to 5; and $B^-$ is a fluorinated alkylsulfonate group, a fluorinated arylsulfonate group, a fluorinated alkylborate group, an alkylsulfonate group or an arylsulfonate group.

It is also possible to use photo acid-generators in which the cations and anions in the above formulas are exchanged each other or combined with various other cations and anions described above. For example, any one of the sulfonium ions represented by the above formulas can be combined with tetra(perfluorophenyl)borate ion, and also any one of the iodonium ions represented by the above formulas can be combined with tetra(per-fluorophenyl)borate ion. Those can be still also employed as the photo acid-generators.

The heat acid-generator is, for example, a salt or ester capable of generating an organic acid. Examples thereof include: various aliphatic sulfonic acids and salts thereof; various aliphatic carboxylic acids, such as, citric acid, acetic acid and maleic acid, and salts thereof; various aromatic carboxylic acids, such as, benzoic acid and phthalic acid, and salts thereof; aromatic sulfonic acids and ammonium salts thereof; various amine salts; aromatic diazonium salts; and phosphonic acid and salts thereof. Among the heat acid-generators usable in the present invention, salts of organic acids and organic bases are preferred, and further preferred are salts of sulfonic acids and organic bases.

Examples of the preferred heat acid-generators containing sulfonate ions include p-toluenesulfonates, benzenesulfonates, p-dodecylbenzenesulfonates, 1,4-naphthalenedisulfonates, and methanesulf Examples of the photo radical-generator include azo compounds, peroxides, acyl phosphine oxides, alkyl phenons, oxime esters, and titanocenes.

According to the present invention, as the photo radical-generator, acyl phosphine oxides, alkyl phenons, oxime esters, or a combination of any of these are more preferable. For examples, 2,2-dimethxye-1,2-diphenylethane-1-on, 1-hydroxy-cyclohexylphenylketone, 2-hydroxy-2-methyl-1-phenylpropan-1-on, 1-[4-(2-hydroxyethoxy)phenyl]-2-hydroxy-2-methyl-1-propane-1-on, 2-hydroxy-1-{4-[4-(2-hydroxy-2-methylpropionyl)benzyl]phenyl}-2-methylpropane-1-on, 2-methyl-1-(4-methylthiophenyl)-2-morpholinopropane-1-on, 2-benzyl-2-dimethylamino-1-(4-morpholinophenyl)-1-butanone, 2-(dimethylamino)-2-[(4-methylphenon)methyl]-1-[4-(4-morpholinyl)phenyl]-1-butanone, 2,4,6-trimethylbenzoyl-diphenylphosphine oxide, bis(2,4,6-trimethylbenzoyl)phenylphosphine oxide, 1,2-octanedione 1-[4-(phenylthio)-2-(o-benzoyl oxime)], ethanone 1-[9-ethyl-6-(2-methylbenzoyl)-9H-carbazole-3-yl]-1-(o-acetyl oxime) or a combination of any of these can be used preferably.

As the examples of the heat radical-generator, 2,2' azobis (2-methylvaleronitrile), 2,2'-azobis(dimethylvaleronitrile) or a combination of any of these can be used preferably.

Examples of the photo base-generator include multi-substituted amide compounds having amide groups, lactams, imide compounds, and compounds having those structures.

Examples of the above heat base-generator include: imidazole derivatives, such as, N-(2-nitrobenzyloxycarbonyl) imidazole, N-(3-nitrobenzyloxycarbonyl)imidazole, N-(4-nitrobenzyloxycarbonyl)imidazole, N-(5-methyl-2-nitrobenzyloxycarbonyl)imidazole, and N-(4-chloro-2-nitro-benzyloxycarbonyl)imidazole; 1,8-diazabicyclo(5,4,0) undecene-7, tertiary amines, quaternary ammonium salts, and mixture thereof. Those base-generators as well as the acid-generators and/or radical-generators can be used singly or in mixture.

According to the present invention, a polymerization initiator generating an acid, base, or radical when exposed to radiation can be used preferably.

Thus, in a preferred embodiment of the present invention, the polymerization initiator can be selected from the group consisting of a photo radical-generator, photo base-generator, photo acid-generator, and a combination of any of these.

More preferably, the polymerization initiator can be a photo radical-generator.

Solvents

According to the present invention, a wide variety of publically known solvents can be used preferably. There are no particular restrictions on the solvent as long as it can homogeneously dissolve or disperse the above a (meth) acrylic polymer, the polymerization initiator, and additives incorporated optionally.

In a preferred embodiment of the present invention, the solvent can be selected from the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; aromatic hydrocarbons, such as, benzene, toluene and xylene; ketones, such as, methyl ethyl ketone, acetone, methyl amyl ketone, methyl isobutyl ketone, and cyclohexanone; alcohols, such as, ethanol, propanol, butanol, hexanol, cyclohexanol, ethylene glycol, and glycerin; esters, such as, ethyl 3-ethoxypropionate, methyl 3-methoxypropionate and ethyl lactate; and cyclic asters, such as, γ-butyrolactone. Those solvents are used singly or in combination of two or more, and the amount thereof depends on the coating method and the thickness of the coating.

More preferably, propylene glycol alkyl ether acetates, such as, propylene glycol monomethyl ether acetate (hereafter "PGMEA"), propylene glycol monoethyl ether acetate, or propylene glycol monopropyl ether acetate can be used.

Even more preferably, PGMEA can be used.

The amount of the solvent in the photosensitive composition can be freely controlled according to the method of coating the composition. For example, if the composition is to be spray-coated, it can contain the solvent in an amount of 90 wt. % or more. Further, if a slit-coating method, which is often adopted in coating a large substrate, is to be carried out, the content of the solvent is normally 60 wt. % or more, preferably 70 wt. % or more.

Chemical Compound Including Two or More of (Meth) Acryloyl Groups

In some embodiments of the present invention, preferably, the photosensitive composition further comprises a chemical compound including two or more of (meth)acryloyl groups.

According to the present invention, the term "(meth) acryloyl group" means a general term of acryloyl group and methacryloyl group.

The chemical compound including two or more of (meth) acryloyl groups can react with the (meth)acrylic polymer, and then can create a crosslinking structure.

Preferably, the chemical compound comprises three or more of (meth)acryloyl groups to create a higher dimension crosslinking structure together with the (meth)acrylic polymer.

As examples of the chemical compound including two or more of (meth)acryloyl groups, esters formed by reacting of a polyol and two or more of (meth)acrylic acid can be used preferably in the present invention.

According to the present invention, the polyol has a basic structure selected from the group consisting of a saturated or unsaturated aliphatic hydrocarbon, aromatic hydrocarbon, heterocyclic hydrocarbon, primary, secondary, or tertiary amine, ether, and two or more of substituents of hydroxyl group. The polyols of the present invention can further include additional substituent like disclosed in for example, JP 2014-114176.

As publically available functional acrylates, bifunctional acrylates, multifunctional acrylates such as A-DOD, A-DCP, and/or A-9300 (from Shin-Nakamura Chemical Co., Ltd.) can be used singly or in mixture preferably.

In a preferred embodiment of the present invention, the amount of the chemical compound comprises three or more of (meth)acryloyl groups is in the range from 0.001 to 90 weight parts based on 100 weight parts of the (meth)acrylic polymer, more preferably 3 to 60 weight parts to realize better solubility with other polymers used in the photosensitive composition of the present invention. Even more preferably, it is in the range from 5 to 50 weight parts based on 100 weight parts of the (meth)acrylic polymer.

Polysiloxane

In some embodiments of the present invention, optionally, the photosensitive composition can further comprise a polysiloxane comprising silsesquioxane unit represented by following chemical formula I:

$(RSiO_{1.5})_x$—           Chemical formula I (wherein the chemical formula I, R is non-hydrolysable group selected from the group consisting of hydrogen, substituted or unsubstituted alkyl group, substituted or unsubstituted aryl group substituted or unsubstituted aralkyl group, and substituted or unsubstituted heterocyclic group; and the symbol x is an integer.)

An alkyl group, if not defined otherwise, preferable is an alkyl group with 1 to 15 C atoms. An aralkyl group stands for-alkyl-aryl and preferably is a benzyl group. Aryl is preferably selected from benzene or naphthalene, and most preferably a benzene ring, where these groups are optionally substituted by Cl, F, 1-7C alkyl, 1-7C alkoxy, CN, —(CO)alkyl, —(CO)O-alkyl.

In a preferred embodiment of the present invention, R can be selected from the group consisting of methyl, ethyl, n-propyl, iso-propyl, t-butyl, n-hexyl, n-decyl, n-butyl, trifluoromethyl, 2,2,2-trifluoroethyl, 3,3,3-trifluoropropyl, cyclohexyl, phenyl, tolyl, and naphthyl groups.

Without wishing to be bound by theory, it is believed that if R is phenyl group, it may lead better solubility of the polysiloxane in the solvent and reduce cracks in the fabricated film and if R is methyl group, the raw materials can more easily be obtained from the market and may lead to higher hardness and better chemical stability of the fabricated film.

Thus, more preferably, R can be a phenyl group or methyl group.

In some embodiments of the present invention, preferably, the polysiloxane comprises the first, second, and third repeating units represented by following chemical formula II:

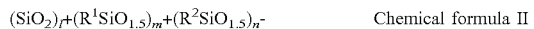

$(SiO_2)_l + (R^1SiO_{1.5})_m + (R^2SiO_{1.5})_n$-    Chemical formula II (wherein the chemical formula II, $R^1$ is a non-hydrolysable group selected from the group consisting of hydrogen, substituted or unsubstituted alkyl group, substituted or unsubstituted aryl group, substituted or unsubstituted aralkyl group, and substituted or unsubstituted heterocyclic group; $R^2$ is a non-hydrolysable group selected from the group consisting of hydrogen, substituted or unsubstituted alkyl group, substituted or unsubstituted aryl group, substituted or unsubstituted aralkyl group, and substituted or unsubstituted heterocyclic group; and the symbol l, m, n are an integer and $0 < m+n$, wherein $R^1$ and $R^2$ are different of each other.)

An alkyl group, if not defined otherwise, preferable is an alkyl group with 1 to 15 C atoms. An aralkyl group stands for-alkyl-aryl and preferably is a benzyl group. Aryl is preferably selected from benzene or naphthalene, and most preferably a benzene ring, where these groups are optionally substituted by Cl, F, 1-7C alkyl, 1-7C alkoxy, CN, —(CO)alkyl, —(CO)O-alkyl.

In a preferred embodiment of the present invention, $R^1$ can be selected from the group consisting of methyl, ethyl, n-propyl, iso-propyl, t-butyl, n-hexyl, n-decyl, n-butyl, trifluoromethyl, 2,2,2-trifluoroethyl, 3,3,3-trifluoropropyl, cyclohexyl, phenyl, tolyl, and naphthyl groups; and $R^2$ can be selected from the group consisting of methyl, ethyl, n-propyl, iso-propyl, t-butyl, n-hexyl, n-decyl, n-butyl, trifluoromethyl, 2,2,2-trifluoroethyl, 3,3,3-trifluoropropyl, cyclohexyl, phenyl, tolyl, and naphthyl groups.

Without wishing to be bound by theory, it is believed that the if R' or $R^2$ is phenyl group, it may lead better solubility of the polysiloxane in the solvent and reduce cracks in the fabricated film and if R' or $R^2$ is methyl group, a raw materials can easily obtain from the market and may lead higher hardness and better chemical stability of the fabricated film.

Thus, more preferably, $R^1$ can be phenyl and $R^2$ can be methyl.

In some embodiment of the present invention, optionally, polysiloxane can further comprise the following repeating unit represented by chemical formula III;

$(R^3SiO_{1.5})_o$-    Chemical formula III (wherein the chemical formula III, $R^3$ is a hydrolysable group selected from alkoxy group, and/or hydroxyl group, the symbol o is zero or an integer.)

Such polysiloxanes like described in for example JP 2014-114176, WO 2012/157696 A1, WO 2013/151166 A can be used as the polysiloxane of the present invention preferably.

Scattering Particles and/or Reflective Index Adjusting Materials

In some embodiments of the present invention, the photosensitive composition can further comprise additives selected from the group consisting of scattering particles, reflective index adjusting material and a combination of any of these.

According to the present invention, as the light scattering particles, any type of publically known light scattering particles having different refractive index from the matrix material of the layer which includes the said light scattering particles and can give Mie scattering effects, can be used preferably as desired.

For examples, small particles of inorganic oxides such as $SiO_2$, $SnO_2$, CuO, CoO, $Al_2O_3$ $TiO_2$, $Fe_2O_3$, $Y_2O_3$, ZnO, MgO; organic particles such as polymerized polystyrene, polymerized PMMA; inorganic hollow oxides such as hollow silica or a combination of any of these; can be used preferably.

Aforementioned the light scattering particles can be used as the index adjusting material.

Preferably, the average particle diameter of the light scattering particles and or the reflective index adjusting material can be in the range from 350 nm to 5 µm.

Preferably, the average particle diameter of the light scattering particles and or the reflective index adjusting material can be in the range from 350 nm to 5 µm.

Without wishing to be bound by theory, it is believed that more than 350 nm average particle diameter may lead to strong forward scattering caused by Mie scattering in a later, even if the refractive index difference between the light scattering particles and the layer matrix is as small as 0.1.

On the other hand, to obtain better layer forming properties by using the light scattering particles (150), maximum average particle diameter is 5 urn or less, preferably. More preferably, from 500 nm to 2 µm.

Coloring Agent

In some embodiment of the present invention, the photosensitive composition can further comprise coloring agent selected from the group consisting of a dye, pigment and a combination of any of these.

According to the present invention, as the coloring agent that can absorb a visible light can be selected from the group consisting of dye, pigment and a combination of any of these. Preferably, any type of publically known dye and/pigment for LCD color filter can be used in this way.

For examples, as shown in "Technologies on LCD Color Filter and Chemicals" CMC Publishing P. 53 (1998)" azochelate pigments, fused azo pigments, quinacridone pigments, isoindolinone pigments, perylene pigments perinone pigments, insoluble azo pigments, phthalocyanice pigments, dioxazine pigments, anthraquinone pigments, thioin pigments or a combination of any of these may be used.

Other Additives

The photosensitive composition of the present invention may contain other additives, if necessary. Examples of the additives include developer-dissolution promoter, scum remover, adhesion enhancer, polymerization inhibitor, defoaming agent, surfactant and sensitizer.

The developer-dissolution promoter or the scum remover has a function of controlling solubility of the formed coating in a developer and thereby of preventing scum from remaining on the substrate after development. As this additive, crown ethers can be adopted. Crown ethers having the simplest structures are represented by the general formula: $(-CH_2-CH_2-O-)_n$. Among them, crown ethers of the formula in which n is 4 to 7 are preferably used in the present invention. Meanwhile, crown ethers are often individually referred to as "x-crown-y-ether" in which x and y represent the total number of atoms forming the ring and the number of oxygen atoms included therein, respectively. In the present invention, the additive can be preferably selected from the group consisting of crown ethers of X=12, 15, 18 and 21 and y=x/3, benzo-condensed products thereof, and cyclohexyl-condensed products thereof. Preferred examples of the crown ethers include 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, dicyclohexyl-15-crown-5-ether, and dicyclohexyl-12-crown-4-ether. Among them, it is particularly preferred to select the additive from the group consisting of 18-crown-6-ether and 15-crown-5-ether. The amount thereof is preferably 0.05 to 15 weight parts, more preferably 0.1 to 10 weight parts, based on 100 weight parts of the (meth)acrylic polymer.

The adhesion enhancer has a function of preventing the pattern from being peeled off by stress applied after curing when a cured film is formed from the photosensitive composition of the present invention. As the adhesion enhancer, imidazoles and silane coupling agents are preferably adopted. Examples of the imidazoles include 2-hydroxybenzimidazole, 2-hydroxyethylbenzimidazole, benzimidazole, 2-hydroxyimidazole, imidazole, 2-mercaptoimidazole, and 2-aminoimidazole. Among them, particularly preferred are 2-hydroxybenzimidazole, benzimidazole, 2-hydroxyimidazole and imidazole.

As the silane coupling agents, known compounds, such as, epoxy-silane coupling agents, amino-silane coupling agents and mercapto-silane coupling agents, can be preferably adopted. Examples thereof include 3-glycidoxypropyltrimethoxysilane, 3-glycidoxypropyltriethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-ureidopropyltrimethoxysilane, 3-chloropropyltrimethoxysilane, 3-mercaptopropyltrimethoxysilane, and 3-isocyanatepropyltrimethoxysilane. Those can be used singly or in combination of two or more. The amount thereof is preferably 0.05 to 15 weight parts based on 100 weight parts of the (meth)acrylic polymer.

It is also possible to employ a silane or siloxane compound having an acidic group as the silane coupling agent. Examples of the acidic group include carboxyl group, an acid anhydride group, and phenolic hydroxyl group. If having a monobasic acid group such as carboxyl or phenolic hydroxyl group, the compound is preferably a single silicon-containing compound having two or more acidic groups.

Examples of the above silane coupling agent include compounds represented by the following formula (B):

$$X_nSi(OR^4)_{4-n} \quad (B)$$

and polymers having polymerization units derived from them. Those polymers may comprise plural kinds of units different in X or $R^3$ in combination.

In the above formula, $R^4$ is a hydrocarbon group, such as, an alkyl group, preferably having 1 to 10 C atoms. Examples thereof include methyl, ethyl, n-propyl, iso-propyl and n-butyl groups. The formula (A) contains plural $R^4$s, which may be the same or different from each other.

In the above formula, X includes an acidic group, such as, thiol, phosphonium, borate, carboxyl, phenol, peroxide, nitro, cyano, sulfo or alcohol group. The acidic group may be protected with a protective group, such as, acetyl, aryl, amyl, benzyl, methoxymethyl, mesyl, tolyl, trimethoxysilyl, triethoxysilyl, triisopropylsilyl or trityl group. Further, X may be an acid anhydride group.

Among the above, $R^4$ and X are preferably methyl group and a carboxylic acid anhydride group, respectively. For example, an acid anhydride group-containing silicone is preferred. Concrete examples thereof are a compound represented by the following formula (B-1) (X-12-967C [trademark], manufactured by Shin-Etsu Chemical Co., Ltd.) and a silicon-containing polymer, such as silicone, having a structure corresponding the formula at the terminal or in the side chain and having a weight average molecular weight of 1000 or less. Also preferred is a dimethyl silicone having a weight average molecular weight of 4000 or less and having a terminal modified with an acidic group, such as, thiol, phosphonium, borate, carboxyl, phenol, peroxide, nitro, cyano or sulfo group. Examples thereof include compounds represented by the following formulas (B-2) and (B-3) (X-22-2290AS and X-22-1821 [trademark], manufactured by Shin-Etsu Chemical Co., Ltd.).

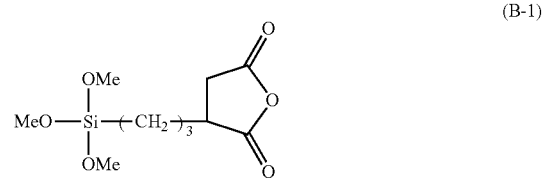

(B-1)

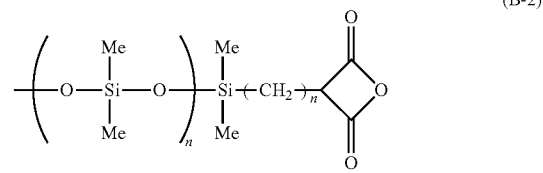

(B-2)

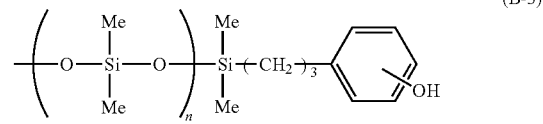

(B-3)

If the silane coupling agent contains a silicone structure and has too large a molecular weight, it has poor compatibility with the composition. Consequently, the coating is dissolved in a developer so insufficiently that reactive groups may remain in the coating. This may cause problems in that, for example, the coating cannot have enough chemical resistance against post-processes. In view of that, the silicon-containing compound has a weight average molecular weight of preferably 5000 or less, more preferably 1000 to 4000. Further, if the acidic group-containing silane or siloxane compound is employed as the silane coupling agent, the amount thereof is preferably 0.01 to 15 weight parts based on 100 weight parts of the (meth)acrylic polymer in the photosensitive composition.

As the polymerization inhibitor, nitrone derivatives, nitroxide radical derivatives and hydroquinone derivatives, such as, hydroquinone, methylhydroquinone and butyllhydroquinine, can be incorporated. Those can be used singly or in combination of two or more. The amount thereof is preferably 0.1 to 10 weight parts based on 100 weight parts of the (meth)acrylic polymer.

Examples of the defoaming agent include: alcohols ($C_1$ to $C_{18}$); higher fatty acids, such as, oleic acid and stearic acid; higher fatty acid esters, such as, glycerin monolaurate; polyethers, such as, polyethylenglycol (PEG) (Mn: 200 to 10000) and polypropyleneglycol (Mn: 200 to 10000); silicone compounds, such as, dimethyl silicone oil, alkyl-modified silicone oil and fluoro-silicone oil; and organic siloxane surfactants described below in detail. Those can be used singly or in combination of two or more. The amount thereof is preferably 0.1 to 3 weight parts based on 100 weight parts of the (meth)acrylic polymer.

If necessary, the photosensitive composition of the present invention can further contain a surfactant, which is incorporated with the aim of improving coatability, developability and the like. The surfactants usable in the present invention are, for example, nonionic, anionic and amphoteric surfactants.

Examples of the nonionic surfactants include: polyoxyethylene alkyl ethers, such as, polyoxyethylene lauryl ether, polyoxyethylene oleyl ether and polyoxyethylene cetyl ether; polyoxyethylene fatty acid diethers; polyoxyethylene fatty acid monoethers; polyoxyethylene-polyoxypropylene block polymer; acetylene alcohol; acetylene glycol derivatives, such as, acetylene glycol, polyethoxyate of acetylene alcohol, and polyethoxyate of acetylene glycol; silicon-containing surfactants, such as, Fluorad ([trade-mark], manufactured by Sumitomo 3M Limited), MEGAFAC ([trademark], manufactured by DIC Corporation), and Surufuron ([trademark], manufactured by Asahi Glass Co., Ltd.); and organic siloxane surfactants, such as, KP341 ([trademark], manufactured by Shin-Etsu Chemical Co., Ltd.). Examples of the above acetylene glycols include: 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

Examples of the anionic surfactants include: ammonium salts and organic amine salts of alkyldiphenylether disulfonic acids, ammonium salts and organic amine salts of alkyldiphenylether sulfonic acids, ammonium salts and organic amine salts of alkylbenzenesulfonic acids, ammonium salts and organic amine salts of polyoxyethylenealkylether sulfuric acids, and ammonium salts and organic amine salts of alkylsulfuric acids.

Further, examples of the amphoteric surfactants include 2-alkyl-N-carboxymethyl-N-hydroxyethyl imidazolium betaine, and laurylic acid amidopropyl hydroxy sulfone betaine.

Those surfactants can be used singly or in combination of two or more. The amount thereof is normally 50 to 2000 ppm, preferably 100 to 1000 ppm based on the photosensitive composition of the present invention.

According to necessity, a sensitizer can be incorporated into the photosensitive composition of the present invention.

Examples of the sensitizer preferably used in the composition of the present invention include Coumarin, ketocoumarin, derivatives thereof, thiopyrylium salts, and acetophenone. Specifically, concrete examples thereof include: sensitizing dyes, such as, p-bis(o-methylstryl)benzene, 7-dimethylamino-4-methylquinolone-2,7-amino-4-methylcoumarin, 4,6-dimethyl-7-ethylaminocoumarin, 2-(p-dimethylaminostryl)pyridylmethyl iodide, 7-diethylaminocoumarin, 7-diethylamino-4-methylcoumarin, 2,3,5,6-1H,4H-tetrahydro-8-methylquinolidino-<9,9a,1-gh>coumarin, 7-diethylamino-4-trifluoromethylcoumarin, 7-dimethylamino-4-trifluoromethylcoumarin, 7-amino-4-trifluoromethylcoumarin, 2,3,5,6-1H,4H-tetrahydroquinolidino-<9,9a,1-gh>Coumarin, 7-ethylamino-6-methyl-4-trifluoromethylcoumarin, 7-ethylamino-4-trifluoromethylcoumarin, 2,3,5,6-1H,4H-tetrahydro-9-carboethoxyquinolidino-<9,9a,1-gh>coumarin, 3-(2'-N-methyl-benzimidazolyl)-7-N,N-diethylaminocoumarin, N-methyl-4-trifluoromethylpiperidino-<3,2-g>Coumarin, 2-(p-dimethylaminostryl)benzo-thiazolylethyl iodide, 3-(2'-benzimidazolyl)-7-N,N-diethylaminocoumarin, 3-(2'-benzothiazolyl)-7-N,N-diethylaminocoumarin, and pyrylium or thiopyrylium salts represented by the following formula. The sensitizing dye makes it possible to carry out patterning by use of inexpensive light sources, such as, a high-pressure mercury lamp (360 to 430 nm). The amount thereof is preferably 0.05 to 15 weight parts, more preferably 0.1 to 10 weight parts based on 100 weight parts of the (meth)acrylic polymer.

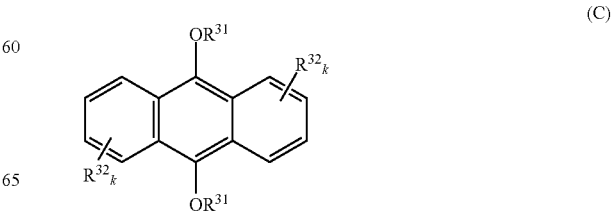

| X | $R_1$ | $R_2$ | $R_3$ | Y |
|---|---|---|---|---|
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_9$ | H | H | $SbF_6$ |

As the sensitizer, it is also possible to adopt a compound having an anthracene skeleton. Concrete examples thereof include compounds represented by the following formula (C):

in which each $R^{31}$ is independently a substituent group selected from the group consisting of alkyl groups, aralkyl groups, aryl groups, hydroxyalkyl groups, alkoxyalkyl groups, glycidyl groups and halogenated alkyl groups;

each $R^{32}$ is independently a substituent group selected from the group consisting of hydrogen, alkyl groups, alkoxy groups, halogen atoms, nitro groups, sulfonic acid groups, hydroxyl group, amino groups, and carboalkoxy groups; and each k is independently an integer of 0 and 1 to 4.

The sensitizers having anthracene skeletons are disclosed in, for example, Patent documents 3 and 4. When the sensitizer having an anthracene skeleton is added, the amount thereof is preferably 0.01 to 5 weight parts based on 100 weight parts of the (meth)acrylic polymer.

Further, if necessary, a stabilizer can be also added into the photosensitive composition of the present invention. The stabilizer can be freely selected from those generally known. However, in the present invention, aromatic amines are preferred because they have high effect on stabilization. Among those aromatic amines, preferred are pyridine derivatives and particularly preferred are pyridine derivatives having bulky substituent groups at 2- and 6-positions. Concrete examples thereof are as follows:

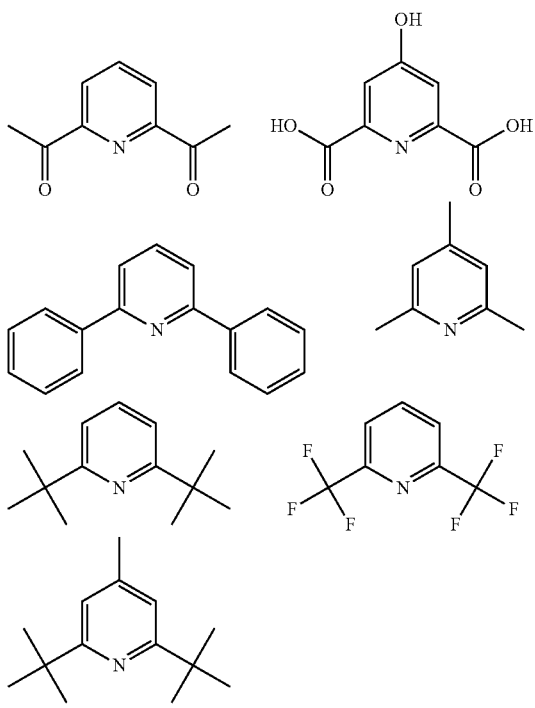

Color Conversion Films of the Present Invention

In another aspect, the invention relates to a color conversion film comprising a plurality of nanosized fluorescent material (110), a wetting and dispersing agent (130), and a polymer matrix (120), wherein the wetting and dispersing agent (130) comprises an anchoring group selected from the group consisting of phosphine groups, phosphine oxide groups, phosphate groups, phosphonate groups, thiol groups, amino groups, carboxyl groups, hetero cyclic groups, silane groups, sulfonic acids, hydroxyl groups, and phosphonic acids.

According to the present invention, the term "film" includes "layer" and "sheet" like structure.

In some embodiment of the present invention, the color conversion film (100) further comprises additives selected from the group consisting of scattering particles, reflective index adjusting material and a combination of any of these.

In some embodiment of the present invention, the color conversion film (100) further comprises coloring agent selected from the group consisting of a dye, pigment and a combination of any of these.

According to the present invention, one of main requirements for the coloring agent is to absorb an excitation light from the light source which light excites the nanosized fluorescent material (110) in the color conversion film (100) to improve color purity of light from the color conversion film (100). Therefore, commercially available yellow pigments for LCD color filter also can be used in a green sub color pixel if the light converting film has the green sub color pixel.

In a preferred embodiment of the present invention, the color conversion film (100) can be a homogeneous color conversion film or can comprise first and second sub color areas (120), in which at least first sub color area emits light having longer peak wavelength than the second sub color areas when it is illuminated by light source.

In a preferred embodiment of the present invention, the color conversion film (100) can comprise red sub color areas, green sub color areas and blue sub color areas.

In some embodiment of the present invention, the color conversion film (100) can mainly consist of red sub color areas, green sub color areas and blue sub color areas like described in FIG. 1-7.

Even more preferably, in case of blue light emitting light source such as blue LED(s) is used, the blue sub color areas can be made without blue nanosized fluorescent material (110).

In that case, the blue sub color areas also can be made without a blue coloring agent.

In some embodiments of the present invention, optionally, the color conversion film (100) further comprises a black matrix (hereafter "BM").

In a preferred embodiment, the BM can be placed in between the sub color areas like described in FIG. 1. In other words, sub color areas of the present invention can be marked out by one or more of the BM.

A material for the BM is not particularly limited. Well known materials, especially well known BM materials for color filters can be used preferably as desired. Such as black dye dispersed polymer composition, like described in JP 2008-260927A, WO 2013/031753A.

Fabrication method of the BM is not particularly limited, well known techniques can be used in this way. Such as, direct screen printing, photolithography, vapor deposition with mask.

In another aspect, the invention relates to use of the photosensitive composition, in a color conversion film fabrication process.

In another aspect, the invention also relates to use of the color conversion film (100) in an optical device.

In another aspect, the invention further relates to an optical device (200) comprising the color conversion film (100).

In a preferred embodiment of the present invention, the optical device (200) can embrace a light source.

According to the present invention, the type of light source in the optical device is not particularly limited. Preferably, UV or blue single color light source can be used.

More preferably, the light source emits light having peak wavelength in a blue light region, such as blue LED, CCFL, EL, or a combination of any of these, can be used.

For the purpose of the present invention, the term "blue" is taken to mean a light wavelength between 380 nm and 515 nm. Preferably, "blue" is between 430 nm and 490 nm. More preferably, it is between 450 nm and 470 nm.

Even more preferably, the light source of the optical device (200) is a blue light source such as blue LED(s) and the color conversion film (100) comprises green sub color areas and red sub color areas.

In a preferred embodiment of the present invention, optionally, the light source can embrace a light guiding plate to increase light uniformity from the light source.

In a preferred embodiment of the present invention, the optical device (200) comprises a light modulator.

In a preferred embodiment of the present invention, the light modulator can be selected from the group consisting of liquid crystal element, Micro Electro Mechanical Systems (here in after "MEMS"), electro wetting element, and electrophoretic element.

In the case of the light modulator is a liquid crystal element, any type of liquid crystal element can be used in this way. For example, twisted nematic mode, vertical alignment mode, IPS mode, guest host mode liquid crystal element, which commonly used for LCDs are preferable.

Furthermore, according to the present invention, normally black TN mode liquid crystal element is also applicable as the light modulator.

Generally, without wishing to be bound by theory, it is said that the normally black TN mode can realize higher contrast ratio but fabrication process is complicated due to the different cell gap in each color pixel to keep good white balance.

According to the present invention, there is no need to change the cell gap of normally black TN mode LC element at each pixel.

Because, according to the present invention, a single color excitation light source can be used preferably in the combination with the color converting film (100). Such as, as a single color excitation light source, UV LED, blue LED.

In that case, the light source emits light having one peak wavelength region and the intensity of the excitation light from the light source can be controlled by the normally black TN mode LC layer having same cell gap at each pixel, then, the excitation light goes into the color conversion film (100) and converted into longer wavelength.

In some embodiments of the present invention, optionally, the optical device (200) comprises a lightscattering layer including the plural of light scattering particles.

In a preferred embodiment of the present invention, the light scattering layer can be placed in between the light source and the color conversion film (100) to reduce glare state of the device caused by ambient light scattering.

Preferably, the plural of light scattering particles can be only in the light scattering layer and/or one or more of other layers that is placed the light source side from the color conversion film (100).

Without wishing to be bound by theory, it is considered that such embodiment may lead less color shift and/or better the brightness contrast of the element under incident light.

Preferably, the light scattering layer is placed onto the surface of the light source side of the color conversion film (100).

Preferably, the plural of light scattering particles can be in the color conversion film (100), in case of the light modulator is placed behind the color conversion film (100) viewed from the light source.

In some embodiments of the present invention, the light modulator is placed on the light extraction side of the color conversion film (100).

In some embodiments of the present invention, the light modulator is placed in between the light source and the color conversion film (100).

According to the present invention, in some embodiments, preferably, the optical device further comprises a film having nano-meter scale structures on one side of the film and the other side of the film can be directly attached onto the outmost surface of the light emission side of the color conversion film (100) to increase outcoupling efficiency of the color conversion film and the optical device (200).

More preferably, the film having nano-meter scale structures can be attached directly onto the color conversion film (100)

Without wishing to be bound by theory it is believed that nano-meter scale structures can increase the amount of light that leaves the light converting film. These structures can be fabricated by well-known techniques, for example with using nano-inprinting techniques.

In general, the nano-meter scale structures can overlap for the plural sub color pixels. Therefore, the nano-meter scale structures is preferably applicable for small size pixels.

More preferably, the film having nano-meter scale structures is moth-eye lens film like described in "Sang Soon Oh et. al., Microelectronic Engineering, vol. 87, Issue 11, November 2010, pp 2328-2331.

According to the present invention, in some embodiments, the surface of the color conversion film (100), which opposite side from the light source, can have nano-meter scale structures instead of the film having nano-meter scale structures. Without wishing to be bound by theory, it is believed that the nano-meter scale structures may prevent light loss by the total reflection.

In some embodiments of the present invention, optionally, the light source can be switchable.

According to the present invention, the term "switchable" means that the light can selectively be switched on or off.

In a preferred embodiment of the present invention, the switchable light source can be selected from the group consisting of, active matrix EL, passive matrix EL, a plural of LEDs and a combination of any of these.

In some embodiments of the present invention, optionally, the optical device (200) can further include a color filter layer. According to the present invention, as the color filter, any type of publically known color filter including red, green and blue sub color region for optical devices, such as LCD color filter, can be used in this way preferably.

In a preferred embodiment of the present invention, the red sub color region of the color filter can be transparent to light wavelength at least in between 610 and 640 nm, and the green sub color region of the color filter is transparent to the light wavelength at least in between 515 and 550 nm.

In some embodiments of the present invention, optionally, the optical device (200) further comprises a selective light reflection layer placed in between the light source and the color conversion film (100).

According to the present invention, the term "light reflection" means reflecting at least around 60% of incident light at a wavelength or a range of wavelengths used during operation of a polarized light emissive device. Preferably, it is over 70%, more preferably, over 75%, the most preferably, it is over 80%.

According to the present invention, the selective light reflection layer can pass through the peak light wavelength from the light source and can reflect the converted light from the color conversion film (100)

A material for the selective light reflection layer is not particularly limited. Well known materials for a selective light reflection layer can be used preferably as desired.

According to the present invention, the selective light reflection layer can be single layer or multiple layers. In a preferred embodiment, the selective light reflection layer is selected from the group consisting of Al layer, Al+MgF$_2$ stacked layers, Al+SiO stacked layers, Al+dielectric multiple layer, Au layer, dielectric multiple layer, Cr+Au stacked layers; with the selective light reflection layer more preferably being Al layer, Al+MgF$_2$ stacked layers, Al+SiO stacked layers, cholesteric liquid crystal layer, stacked cholesteric liquid crystal layers.

Examples of cholesteric liquid crystal layers have been described in, for example, the international patent application laid-open No. WO 2013/156112A, WO 2011/107215 A.

In general, the methods of preparing the selective light reflection layer can vary as desired and selected from well-known techniques.

In some embodiments, the selective light reflection layer except for cholesteric liquid crystal layers can be prepared by a gas phase based coating process (such as Sputtering, Chemical Vapor Deposition, vapor deposition, flash evaporation), or a liquid-based coating process.

In case of the cholesteric liquid crystal layers, can be prepared by method described in, for example, WO 2013/156112A, or WO 2011/107215 A.

In a preferred embodiment of the present invention, the optical device (200) can be selected from the group consisting of a liquid crystal display, electro-luminescent displays, MEMS display, electro wetting display, and electrophoretic display.

More preferably, the optical device (200) can be a liquid crystal display, such as twisted nematic liquid crystal display, vertical alignment mode liquid crystal display, IPS mode liquid crystal display, guest host mode liquid crystal display, or the normally black TN mode liquid crystal display.

Examples of optical devices have been described in, for example, WO 2010/095140 A2 and WO 2012/059931 A1.

Fabrication Methods

In another aspect, the present invention furthermore relates to method for preparing the color conversion film (100), wherein the method comprises following steps (a) and (b) in this sequence;
 (a) providing the photosensitive composition onto a substrate
 (b) polymerizing the photosensitive composition by heat treatment, or exposing the photosensitive composition under ray of light or a combination of any of these.

In some embodiment of the present invention, the heat temperature of the heat treatment in step (b) can be in the range from 40° C. to 150° C. In a preferred embodiment of the present invention, the baking temperature in baking step is in the range from 70° C. to 140° C. More preferably, it is in the range from 80° C. to 120° C.

The heat treatment time is not particularly restricted, preferably it is from seconds to 24 hours, more preferably from 60 seconds to 3 hours.

Coating Step

According to the present invention, to provide the photosensitive composition onto a substrate, any type of publically known coating method can be used preferably. For examples, immersion coating, gravure coating, roll coating, bar coating, brush coating, spray coating, doctor coating, flow coating, spin coating, and slit coating.

The substrate to be coated with the photosensitive composition in step (a) is also not particularly limited, and can be properly selected from, for example, a silicon substrate, a glass substrate and a polymer film. And the substrate can be solid or flexible.

Prebaking Step

In a preferred embodiment of the present invention, optionally, after step (a), prebaking (preheating treatment) step can be applied to the photosensitive composition provided onto a substrate for the purposes of drying and of reducing the solvent remaining therein. The prebaking step can be carried out at a temperature of generally 50 to 150° C., preferably 90 to 120° C. for 10 to 300 seconds, preferably 30 to 120 seconds on a hot-plate or for 1 to 30 minutes in a clean oven.

Exposing Step as Step (b) to Polymerlize the Photosensitive Composition

In a preferable embodiment of the present invention, after the coating is formed, the surface thereof can be exposed to light. As a light source for the exposure, it is possible to adopt any light source used in conventional pattern-formation processes. Examples of the light source include high-pressure mercury lamp, low-pressure mercury lamp, metal halide lamp, xenon lamp, laser diode and LED. Light for the exposure is normally UV rays of g-line, h-line, i-line or the like. Except for in the case of ultrafine fabrication of semiconductors and the like, it is general to use light of 360 to 430 nm (high-pressure mercury lamp) for patterning in several micrometers to several tens of micrometers. Particularly in producing a liquid crystal display, light of 430 nm is often used. As described above, in that case, it is advantageous to combine a sensitizing dye with the negative-working photosensitive composition of the present invention. Energy of the exposure light depends on the light source and the thickness of the coating, but is generally 10 to 2000 mJ/cm$^2$, preferably 20 to 1000 mJ/cm$^2$ to obtain satisfying resolution and to avoid halation.

In order that the coating can be imagewise exposed to light, common photomasks are employable. Any photomask can be selected from known ones. There are no particular restrictions on the environmental conditions in the exposure, and the exposure can be carried out under an ambient atmosphere (the normal atmosphere) or under a nitrogen atmosphere. If a film is to be formed on the whole surface of the substrate, the whole substrate surface is exposed to light. In the present invention, the term "pattern film" includes a film thus formed on the whole surface of the substrate.

Post-Exposure Baking Step

After the exposing step (b), optionally, post-exposure baking can carried out according to necessity with the aim of promoting interpolymer reactions caused by the reaction initiator in the exposed area of the coating.

The temperature of the post-exposure baking is preferably 40 to 150° C., more preferably 60 to 120° C.

Development Step

After the exposing step (b), development step (c) can optionally be carried out. If a film is to be formed on the whole surface of the substrate, development step (c) can be omitted. As a developer used in the development step, it is possible to adopt any developer employed in developing conventional photosensitive compositions. In the present invention, TMAH aqueous solutions are used to determine the dissolution rate of the photosensitive composition but they by no means restrict the developer for forming a cured film. Preferred examples of the developer include alkali developers which are aqueous solutions of alkaline compounds, such as, tetraalkylammonium hydroxide, choline, alkali metal hydroxides, alkali metal (meta)silicates (hydrate), alkali metal (meta)phosphates (hydrate), ammonia, alkylamines, alkanolamines, and heterocyclic amines. Particularly preferred is an aqueous solution of tetraalkylammonium hydroxide. Those alkali developers may contain water-soluble organic solvents, such as, methanol and ethanol, or surfactants, if necessary. The developing method can be freely selected from known methods, such as, dip, paddle, shower, slit, cap coat and spray development processes. As a result of the development, a pattern can be obtained. After developed with a developer, the pattern is preferably washed with water. Or acetone washing process after development step can be optionally added.

Preferably, the method further comprises step (d) before step (a), (d) ligand exchange of the nanosized fluorescent material with the wetting and dispersing additive With using the ligand exchange process, the wetting and dispersing additive can be introduced onto the surface of the nanosized fluorescent material. Such ligand exchange process described in for example, Thomas Nann, Chem. Commun., 2005, 1735-1736, DOI: 10.1039/b-414807j can be used preferably.

In some embodiments of the present invention, an ultracentrifuge process after the ligand exchange process of the nanosized fluorescent material can be applied to remove the excess amount of wetting and dispersing additive before mixing the ligand exchanged nanosized fluorescent material with (meth)acrylic polymer mixture, if desired.

In another aspect, the present invention furthermore relates to method for preparing the optical device (200), wherein the method comprises following step (A);

(A) providing the color conversion film (100) in an optical device

The invention is described in more detail in reference to the following examples, which are only illustrative and do not limit the scope of the invention.

EXAMPLES

Example 1: In the present invention, the color conversion film (100) can be peeled off from a substrate as shown in FIG. 1.

In this example, the color conversion film has red, green and blue sub color area. In the red and green sub color area, a plurality of nanosized fluorescent material (red or green), (meth)acrylic polymer, and a wetting and dispersing agent are at least incorporated. And optionally, a coloring agent and scattering particle can be incorporated.

Figure 2:
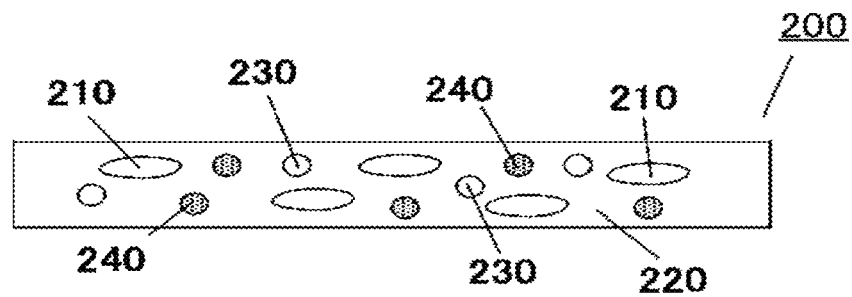
FIG. 2: shows a cross sectional view of a schematic of another embodiment of a color conversion film of the invention.

Example 2: FIG. 2 shows one example of the color conversion film of the present invention, including at least a plurality of nanosized fluorescent material (for example, red and/or green), (meth)acrylic polymer, and a wetting and dispersing agent. Other components such as a coloring agent and scattering particle can be optionally incorporated.

Figure 3:
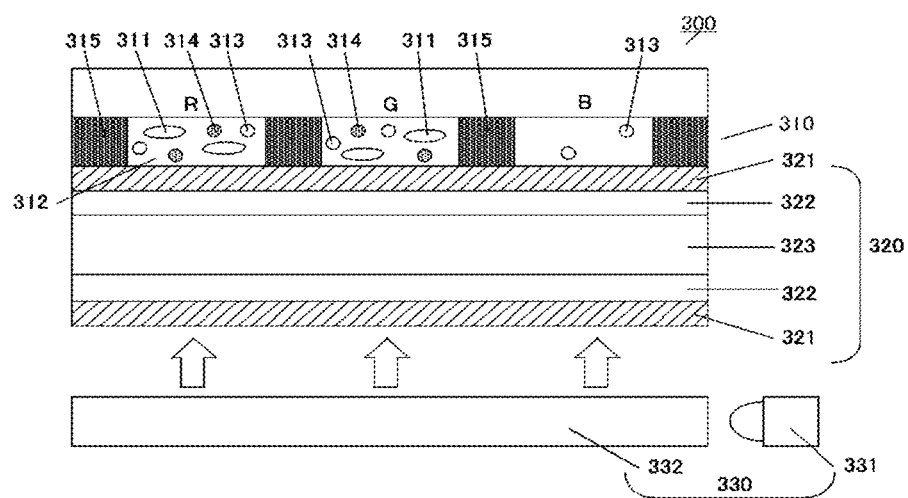
FIG. 3: shows a cross sectional view of a schematic of one embodiment of an optical device of the invention.

Example 3: FIG. 3 shows one example of the optical device of the present invention.

In this example, a color filter layer is omitted.

Figure 4:
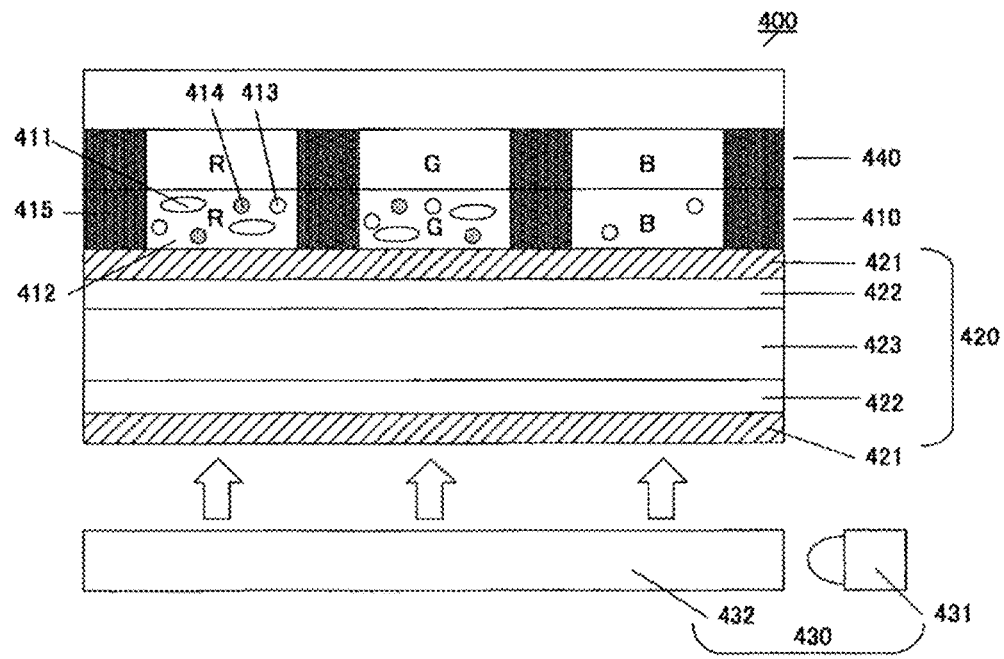
FIG. 4: shows a cross sectional view of a schematic of another embodiment of an optical device of the invention.

Example 4: FIG. 4 shows another example of the optical device of the present invention.

In this example, a color filter layer is stacked onto the color conversion film.

Figure 5:
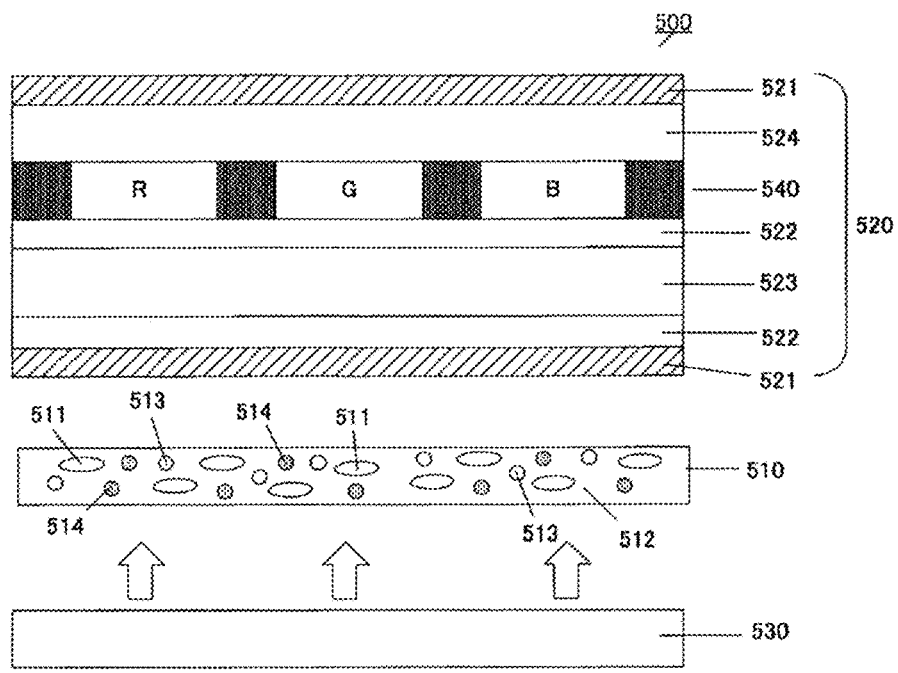
FIG. 5: shows a cross sectional view of a schematic of another embodiment of an optical device of the invention.

Example 5: FIG. 5 shows another example of the optical device of the present invention.

In this example, a homogeneous color conversion film is placed underneath of the light modulator.

Figure 6:
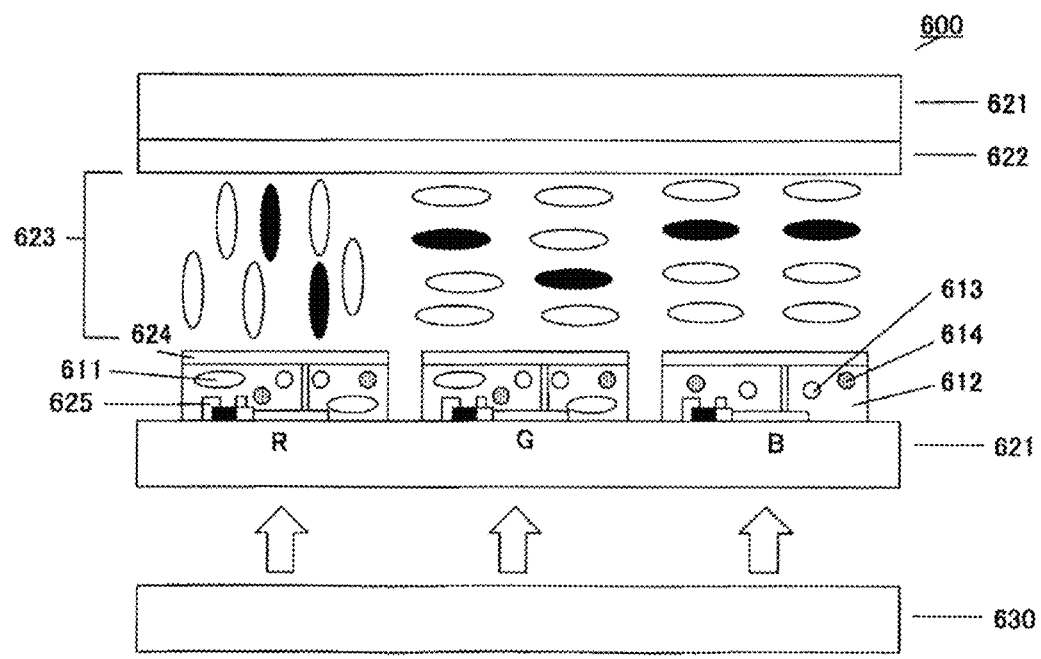
FIG. 6: shows a cross sectional view of a schematic of another embodiment of an optical device of the invention.

Example 6: FIG. 6 shows another example of the optical device of the present invention.

In this example, a guest host mode liquid crystal (623) is used with a blue light source (630) and therefore, two polarizers can be omitted and the color conversion film was fabricated as a layer insulation of the TFT.

Figure 7:
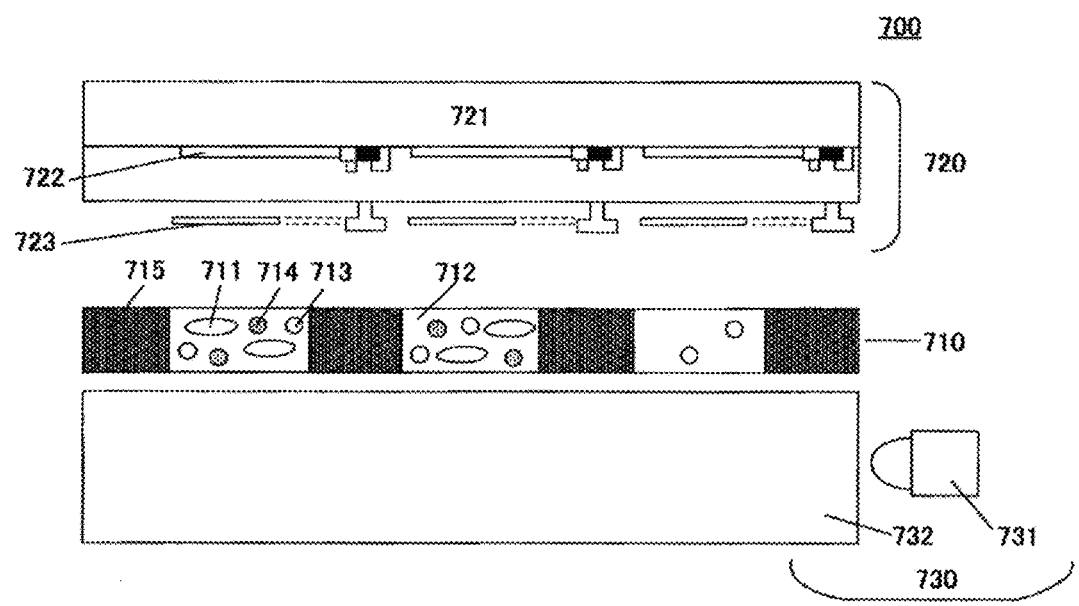
FIG. 7: shows a cross sectional view of a schematic of another embodiment of an optical device of the invention.

Example 7: FIG. 7 shows another example of the present invention.

In this example, a MEMS shutter is used preferably.

Instead of the color conversion film mentioned in the FIG. 7 (710), the color conversion film can be fabricated as the layer insulation of the MEMS shutter system.

Each feature disclosed in this specification, unless stated otherwise, may be replaced by alternative features serving the same, equivalent, or similar purpose. Thus, unless stated otherwise, each feature disclosed is but one example of a generic series of equivalent or similar features.

Definition of Terms

According to the present invention, the term "transparent" means at least around 60% of incident light transmittal at the thickness used in a polarized light emissive device and at a wavelength or a range of wavelength used during operation of a polarized light emissive device. Preferably, it is over 70%, more preferably, over 75%, the most preferably, it is over 80%.

The term "fluorescent" is defined as the physical process of light emission by a substance that has absorbed light or other electromagnetic radiation. It is a form of luminescence. In most cases, the emitted light has a longer wavelength, and therefore lower energy, than the absorbed radiation.

The term "semiconductor" means a material which has electrical conductivity to a degree between that of a conductor (such as copper) and that of an insulator (such as glass) at room temperature.

The term "inorganic" means any material not containing carbon atoms or any compound that containing carbon atoms ionically bound to other atoms such as carbon monoxide, carbon dioxide, carbonates, cyanides, cyanates, carbides, and thiocyanates.

The term "emission" means the emission of electromagnetic waves by electron transitions in atoms and molecules.

The term "photosensitive" means that the respective composition chemically reacts in response to suitable light irradiation. The light is usually chosen from visible or UV light. The photosensitive response includes hardening or softening of the composition, preferably hardening. Preferably the photosensitive composition is a photo-polymerizable composition.

The working examples 1-6 below provide descriptions of the present invention, as well as an in detail description of their fabrication.

WORKING EXAMPLES

Working Example 1: Fabrication of Photosensitive Compositions with a Dispersing Agent and Color Conversion Films Ligand Exchange Process 30 mg of tri-n-octylphosphine oxide (hereafter "TOPO") covered red emission type rod-shaped nanocrystals (from QLight Nanotech Ltd) and 13 mg of wetting and dispersing agent BYK-LPN6919 ([trademark], from BYK co.) were dispersed in 1.5 ml of chloroform and stirred at room temperature in air condition overnight.

Then, 0.5 g of PGMEA (propylene glycol monomethyl ether acetate) was added into the obtained solution.

After adding PGMEA, chloroform in the solution was evaporated at 85° C. for 120 minutes in oil bath.

After the evaporation process of the chloroform, PGMEA was again added into the solution to adjust total weight of the obtained solution to 260 mg.

Finally, the solution containing the wetting and dispersing agent covered red emission type rod-shaped nanocrystals and PGMEA solvent was obtained.

Fabrication Process of the Photosensitive Compositions of the Invention

Polymer mixture L1 (from Merck KGaA) comprising an acryl polymer mixture soluble in TMAH aqueous solution, wherein the polymer mixture L1 comprises acryl polymer mixture including an acrylic unit including an acid group and a silane modified acrylic unit, a photo-radical generator Irgacure OXE02 and Irgacure 369 ([Trade mark] from BASF SE, each 6 wt. % based on the weight of the acrylic polymer mixture), Acryl monomer A-DOD, and A-DCP (from Shin-Nakamura Chemical, each 20 wt. % based on the weight of the acrylic polymer mixture), and 70 wt. % of PGMEA solvent based on the weight of the acrylic polymer, and the resulting solution of the wetting and dispersing additive covered red emission type rod-shaped nanocrystals with PGMEA were mixed at room temperature. Finally, the first red-type photosensitive composition (86 wt. % of rod-shaped nanocrystals based on the weight of the total solid components of polymer mixture L1) was fabricated.

Fabrication Process of the Color Conversion Films of the Present Invention

A glass substrate was cleaned by sonicating in acetone.

Then the first red type photosensitive composition was coated onto the cleaned glass substrate with using bar coating technique. The resulting substrate was heated at 100° C. for 90 seconds at air condition to evaporate the solvent.

After the baking, half area of the color conversion film was covered by mask to prevent light exposure. Then the color conversion film was exposed to 3.68 mW/cm² of i, g, h lines lightemission (100 mJ/cm², USH-1005D, Ushio Co.) for 28 seconds.

Then, the red color conversion film was exposed with tetramethylammonium hydroxide (TMAH) for 5 minutes and rinsed with flowing water for 30 seconds at room temperature.

After the rinse process, the obtained color conversion film was cured at 100° C. for 90 seconds at air condition.

Finally, the No. 1 red color conversion film fabricated onto the substrate was obtained.

Working Example 2: Fabrication of Photosensitive Compositions and Color Conversion Films In the same manner as described in the working example 1 above, except for 25 mg of wetting and dispersing agent BYK-LPN6919 ([trademark], from BYK co.) was used instead of 13 mg of wetting and dispersing agent BYK-LPN6919, the second red-type photosensitive composition was prepared and No. 2 color conversion film was fabricated.

Working Example 3: Fabrication of Photosensitive Compositions and Color Conversion Films Ligand Exchange Process In the same manner as described in the ligand exchange process of the working example 1, except for 19 mg, 38 mg of BYK-103 ([trademark], from BYK Co.) were used instead of BYK-LPN6919.

Then, the two types of solutions comprising the wetting and dispersing additive covered (19 mg of BYK-103 and 38 mg of BYK-103 [trademark]) red emission type rod-shaped nanocrystals and PGMEA solvent were obtained.

Fabrication Process of the Photosensitive Compositions of the Invention

Polymer mixture L1 (from Merck KGaA) comprising an acryl polymer mixture soluble in TMAH aqueous solution, wherein the polymer mixture L1 comprises acryl polymer including an acrylic unit including an acid group and a silane modified (meth)acrylic unit, a photo-radical generator Irgacure OXE02 and Irgacure 369 ([Trade mark] from BASF SE, each 6 wt. % based on the weight of the acrylic polymer mixture), Acryl monomer A-DOD, and A-DCP (from Shin-Nakamura Chemical, each 20 wt. % based on the weight of the acrylic polymer mixture), and 70 wt. % of PGMEA solvent based on the weight of the acrylic polymer mixture, and the resulting solution of the wetting and dispersing additive covered red emission type rod-shaped nanocrystals with PGMEA were mixed at room temperature.

Finally, the $3^{rd}$ and $4^{th}$ red-type photosensitive compositions (each 86 wt. % of rod-shaped nanocrystals based on the weight of the acryl polymer mixture) were fabricated.

Fabrication Process of the Color Conversion Films of the Present Invention

A glass substrate was cleaned by sonicating in acetone.

Then the 3rd red type photosensitive composition was coated onto the cleaned glass substrate with using bar coating technique. The resulting substrate was heated at 100° C. for 90 seconds at air condition to evaporate the solvent.

After the baking, half area of the color conversion film was covered by the mask to prevent light exposure. Then the color conversion film was exposed to 3.68 mW/cm² of i, g, h lines light emission (100 mJ/cm², USH-1005D, Ushio Co.) for 28 seconds.

Then, the red color conversion film was exposed with tetramethylammonium hydroxide (TMAH) for 5 minutes and rinsed with flowing water for 30 seconds at room temperature.

After the rinse process, the obtained color conversion film was cured at 100° C. for 90 seconds at air condition.

Finally, No. 3 red color conversion film was obtained.

In the same manner as described in fabrication process of the color conversion films in working example 3 above, except for the $4^{th}$ red type photosensitive composition was used, instead of the $3^{rd}$ red type photosensitive composition, No. 4 red color conversion film was obtained.

Working Example 4: Development Characteristic Observation of the Color Conversion Films 4-1: Residual Film Thickness Observation Alpha-Step AS500 (KLA Tencor) was used to measure residual film thickness in unexposed area of the color conversion films.

Figure 8:
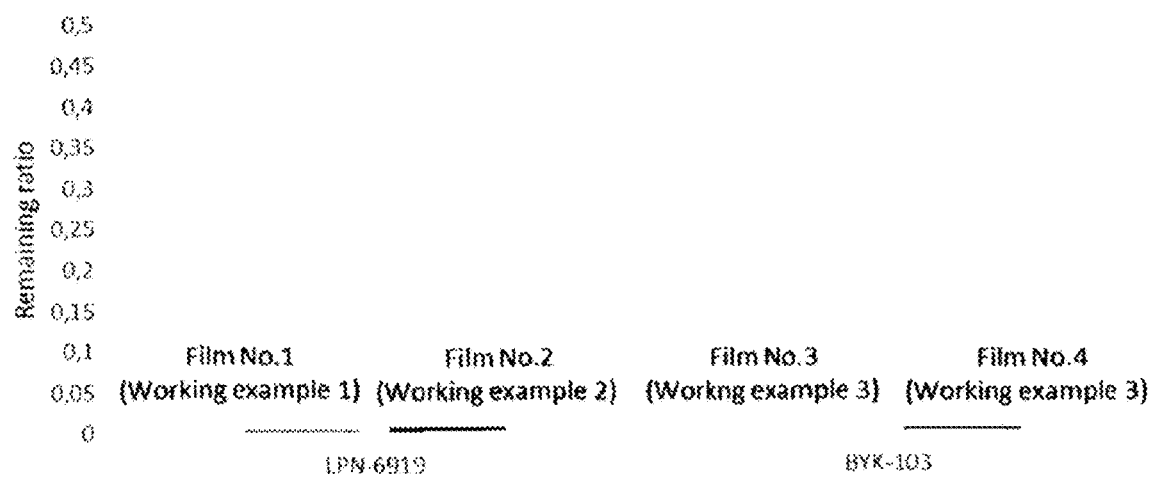
FIG. 8: shows observation results in working example 4.

FIG. 8 shows the observation results.

As shown in FIG. 8, remaining ratio of each films is almost zero.

Development was successfully achieved.

After the observations 4-1 and 4-2, acetone rinsing of the films took place, after the acetone rinsing, no remaining layer in unexposed area was observed.

4-2: Fluorescence Observation

Microscope OLYMPUS BX-51 equipped with fluorescent mirror unit U-MWIB3 consisting of a excitation filter (passing the excitation light in between 460 nm-495 nm) and absorption filter/Dichroic Mirror passing 510 nm or more longer lightwavelength, was used for microscopic observation of the color conversion films fabricated in working examples 1 to 3.

In a fluorescence observation mode, excitation light from the 100 W Hg lamp was filtered by the excitation filter of the fluorescent mirror unit U-MW1B3, then, the filtered excitation light went into the color conversion films.

The converted light and the excitation light from the light source and passed through the color conversion film was then filtered by the absorption filter/Dichroic Mirror.

Magnification ratio during the fluorescence observation was ×4.

Comparison between exposed area and unexposed area of the color conversion films were done after development. Homogeneously red image was obtained in the exposed area of the color conversion films and black state was obtained in the unexposed area of the color conversion films.

Working Example 5: Fine Patterning of Color Conversion Film

In the same manner as described in the working example 1, except for 30 mg of tri-n-octylphosphine oxide (hereafter "TOPO") covered green emission type rod-shaped nanocrystals (from QLight Nanotech Ltd) was used instead of red emission type rod-shaped nanocrystals, and a fine pattern metal mask was used in the film fabrication process instead of the mask, fine patterned green color conversion film was fabricated.

And then, fluorescence observation was carried out in the same manner as described in working example 4, except for the color conversion film fabricated in working example 5 was used.

Figure 9:
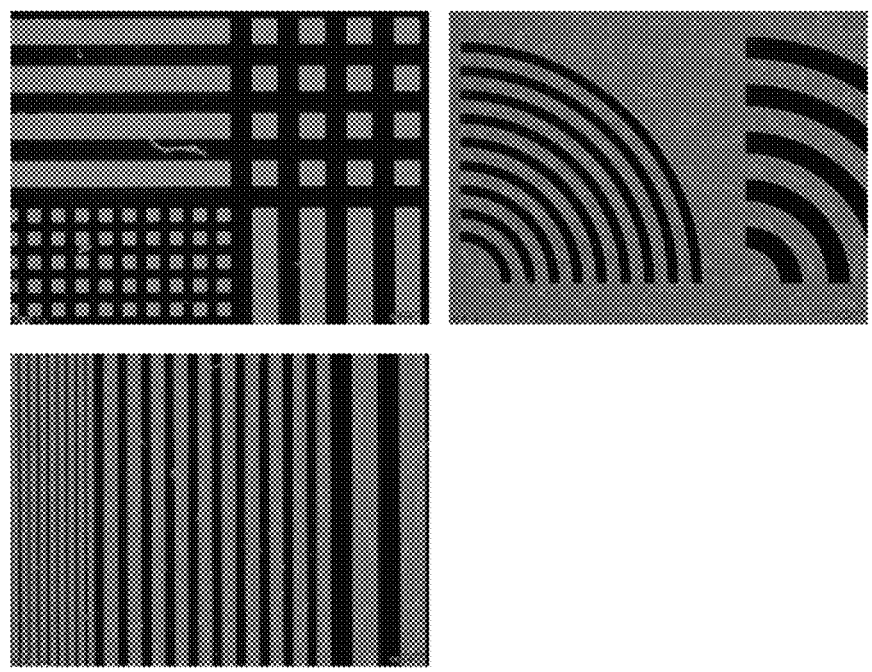
FIG. 9: shows observation results in working example 5.

FIG. 9 shows fine patterning results of the green color conversion film of the working example 5.

As shown in FIG. 9, fine patterned green color conversion film was successfully obtained.

Working Example 6: Fabrication of Photosensitive Compositions with a Dispersing Agent and Films Two types of photosensitive compositions with different mixing ratio of the wetting and dispersing agent to Polymer mixture S1 were fabricated.

Mixing ratio 1 was 0.21 (the wetting and dispersing agent:Polymer mixture Si=0.21:1) and mixing ratio 2 was 0.43.

Fabrication Process of the Photosensitive Compositions

Polymer mixture S1 (35 wt. % of PGMEA solution, from Merck KGaA) comprising a polysiloxane-acryl polymer mixture soluble in TMAH aqueous solution, wherein the polysiloxane-acryl polymer mixture comprises 30 wt. % of polysiloxane represented by the formula $(SiO_2)_l + (R^1SiO_{1.5})_m + (R^2SiO_{1.5})_n + (R_3SiO_{1.5})_o$ ($R_1$ is phenyl, $R^2$ is methyl, and $R^2$ is hydroxyl group, l:m:n:o=0:4:5:1), 35 wt. % of silane modified acryl polymer Al (weight-average molecular weight: 6,000; value of double bond equivalent in the (meth)acrylic polymer is 24 g/eq), 35 wt. % of acryl polymer including an carboxyl group (weight-average molecular weight: 6,000), a photo-radical generator OXE01 and OXE02 (from BASF SE, 6 wt. % in total based on the weight of the polysiloxane-acryl polymer mixture), Acryl monomer A-DOD, A-DCP, A-9300 (from Shin-Nakamura Chemical, each 10 wt. % based on the weight of the polysiloxane-acryl polymer mixture), and the wetting and dispersing additive BYK-LPN6919 ([trademark] from BYK) were mixed at room temperature to fabricate two types of photosensitive compositions with different mixing ratio of the wetting and dispersing agent to Polymer mixture L1 (Mixing ratio 1 was 0.21 and mixing ratio 2 was 0.43).

Film Fabrication Process

A glass substrate was cleaned by sonicating in acetone.

Then the photosensitive composition having mixing ratio 0.21 was coated onto the cleaned glass substrate with using bar coating technique. The resulting substrate was heated at 100° C. for 90 seconds at air condition to evaporate the solvent.

After the baking, half area of the color conversion film was covered by the mask to prevent light exposure. Then the color conversion film was exposed to 3.68 mW/cm$^2$ of i, g, h lines light emission (50 mJ/cm$^2$, USH-1005D, Ushio Co.) for 14 seconds.

Then, the film was exposed with tetramethylammonium hydroxide (TMAH) for 5 minutes and rinsed with flowing water for 30 seconds at room temperature.

After the rinse process, the obtained color conversion film was cured at 100° C. for 90 seconds at air condition.

Then, the film 1 was fabricated.

In the same manner as described in film fabrication process in working example 6 above, except for the photosensitive composition having mixing ratio 0.43 was used, the film 2 was fabricated.

The residual film thickness in the unexposed area of the film 1 and film 2 were measured with Alpha-Step AS500 (KLA Tencor) before development and after development.

Comparative Example 1: Fabrication of Photosensitive Compositions with a Dispersing Agent and Films In the same manner as described in working example 6 except for BYK 2000 was used instead of BYK-LPN6919, film 3 (mixing ratio 0.21) and film 4 (mixing ratio 0.43) were fabricated.

The residual film thickness in the unexposed area of the film 3 and film 4 were measured with Alpha-Step AS500 (KLA Tencor) before development and after development.

Comparative Example 2: Fabrication of Photosensitive Compositions with a Dispersing Agent and Films In the same manner as described in working example 6 except for BYK 2001 was used instead of BYK-LPN6919, film 5 (mixing ratio 0.21) and film 6 (mixing ratio 0.43) were fabricated.

The residual film thickness in the unexposed area of the film 5 and film 6 were measured with Alpha-Step AS500 (KLA Tencor) before development and after development.

The residual film ratios of the films 1, 2, 3, 4, 5, 6 were calculated with following calculation formula.

Figure 10:
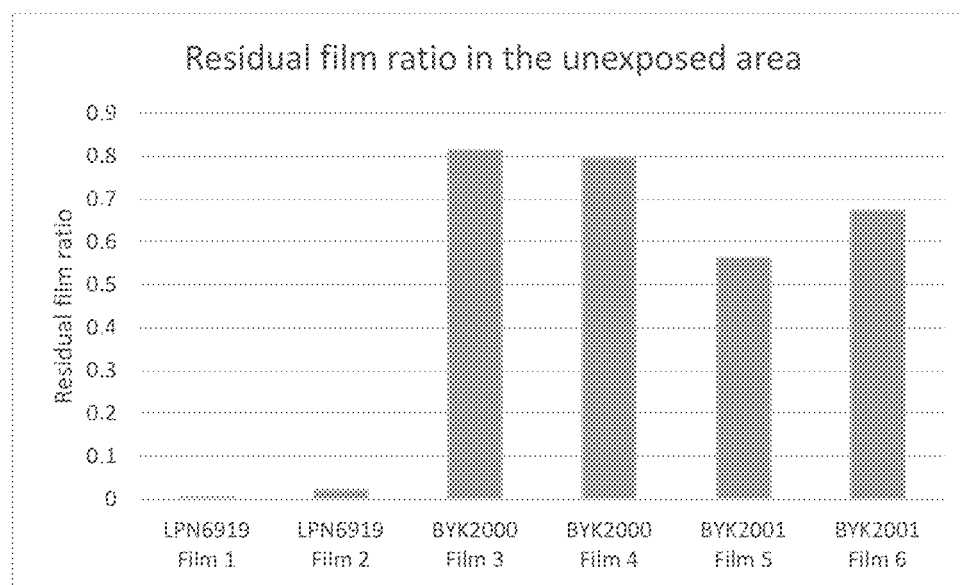
FIG. 10: shows residual film ratios of the films 1, 2, 3, 4, 5 and 6.

> Residual film ratio=film thickness in the unexposed area of the film after development/film thickness in the unexposed area of the film before development FIG. 10 shows the residual film ratios in the unexposed area of the films 1, 2, 3, 4, 5 and 6.

The invention claimed is:

1. A polymerized photosensitive composition comprising a plurality of nanosized fluorescent material, a (meth)acrylic polymer and a wetting and dispersing agent, wherein the nanosized fluorescent material is selected from the group consisting of nanosized inorganic phosphor materials, quantum sized materials and a combination thereof, and wherein the wetting and dispersing agent is a copolymer selected from the group consisting of graft copolymers, block copolymers, alternating copolymers, and random copolymers and comprises an anchoring group selected from the group consisting of phosphine groups, phosphine oxide groups, phosphate groups, phosphonate groups, thiol groups, tertiary amine, carboxyl groups, hetero cyclic groups, silane groups, sulfonic acids, hydroxyl groups, and phosphonic acids and wherein the copolymer comprises polymer unit A including the anchoring group, and polymer unit B that does not include any anchoring group and polymer unit B comprises a polymer chain selected from the group consisting of polyethylene glycols, polyester, polylactic acids, polyvinyl alcohols, polyvinylpyrrolidones, celluloses and derivatives thereof.

2. The polymerized photosensitive composition according to claim 1, wherein the anchoring group of the wetting and dispersing agent is selected from the group consisting of tertiary amine, phosphine oxide groups, phosphonic acids, and phosphate groups.

3. The polymerized photosensitive composition according to claim 1, wherein the anchoring group is a tertiary amine represented by following chemical formula (I);

$$-NR_1R_2- \qquad (I)$$

wherein $R_1$ is an alkyl group having carbon atoms 1 to 30, or an aryl group having carbon atoms 1 to 30; $R_2$ is an alkyl group having carbon atoms 1 to 30, or an aryl group having carbon atoms 1 to 30; $R_1$ and $R_2$ can be same or different of each other.

4. The polymerized photosensitive composition according to claim 1, wherein the copolymer is a block copolymer or a graft copolymer represented by following chemical formula (II) or (III);

$$A_n\text{-}B_m- \qquad (II)$$

$$B_o\text{-}A_n\text{-}B_m- \qquad (III)$$

(where in the formulae (II) and (III), the symbol "A" represents polymer unit A including the anchoring group; the symbol "B" is taken to mean the polymer unit B that does not include any one of the anchoring group; the symbols "n", "m", and "o" are integer.

5. The polymerized photosensitive composition according to claim 1, wherein the polymerized photosensitive composition comprises a polymerization initiator.

6. The polymerized photosensitive composition according to claim 1, wherein the polymerized photosensitive composition further comprises a solvent.

7. The polymerized photosensitive composition according to claim 1, wherein the polymerized photosensitive composition further comprises a chemical compound including two or more of (meth)acryloyl groups.

8. The polymerized photosensitive composition according to claim 1, wherein the (meth)acrylic polymer comprises a (meth)acrylic unit including an acid group.

9. The polymerized photosensitive composition according to claim 1, wherein the (meth)acrylic polymer further comprises a silane modified (meth)acrylic unit.

10. The polymerized photosensitive composition according to claim 1, wherein the polymerized photosensitive composition further comprises additives selected from the group consisting of scattering particles, reflective index adjusting material and a combination of any of these.

11. The polymerized photosensitive composition according to claim 1, where in the polymerized photosensitive composition further comprises coloring agent selected from the group consisting of a dye, pigment and a combination of any of these.

12. A color conversion film comprising a plurality of nanosized fluorescent material, a wetting and dispersing agent, and a polymer matrix, wherein the nanosized fluorescent material is selected from the group consisting of nanosized inorganic phosphor materials, quantum sized materials and a combination thereof, and wherein the wetting and dispersing agent is a copolymer selected from the group consisting of graft copolymers, block copolymers, alternating copolymers, and random copolymers and comprises an anchoring group selected from the group consisting of phosphine groups, phosphine oxide groups, phosphate groups, phosphonate groups, thiol groups, tertiary amine, carboxyl groups, hetero cyclic groups, silane groups, sulfonic acids, hydroxyl groups, and phosphonic acids.

13. The color conversion film according to claim 12, wherein the color conversion film further comprises an additive selected from the group consisting of scattering particles, reflective index adjusting material and a combination of any of these.

14. The color conversion film according to claim 12, wherein the color conversion film further comprises a coloring agent selected from the group consisting of a dye, pigment and a combination of any of these.

15. A color conversion film fabrication process which comprises preparing the polymerized photosensitive composition according to claim 1 in said color conversion film fabrication process.

16. An optical device comprising the color conversion film according to claim 12.

17. The optical device according to claim 16, wherein the optical device further comprises a film having nano-meter scale structures and the film is attached onto the outmost surface of the color conversion film.

18. A method for preparing the optical device, wherein the method comprises following step (A);

(A) providing the color conversion film according to claim 12, in an optical device.

* * * * *